US010157981B1

(12) United States Patent
Tseng et al.

(10) Patent No.: US 10,157,981 B1
(45) Date of Patent: Dec. 18, 2018

(54) STRUCTURE AND FORMATION METHOD OF SEMICONDUCTOR DEVICE STRUCTURE WITH WELL REGIONS

(71) Applicant: Taiwan Semiconductor Manufacturing Co., Ltd., Hsinchu (TW)

(72) Inventors: Chih-Yu Tseng, Hsinchu County (TW); Chia-Pin Hung, Kaohsiung (TW); Ming-Hsien Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/652,589

(22) Filed: Jul. 18, 2017

(51) Int. Cl.
| | |
|---|---|
| *H01L 29/06* | (2006.01) |
| *H01L 29/78* | (2006.01) |
| *H01L 29/10* | (2006.01) |
| *H01L 29/66* | (2006.01) |
| *H01L 21/265* | (2006.01) |
| *H01L 21/266* | (2006.01) |
| *H01L 21/324* | (2006.01) |

(52) U.S. Cl.
CPC ........ *H01L 29/0634* (2013.01); *H01L 21/266* (2013.01); *H01L 21/26513* (2013.01); *H01L 21/324* (2013.01); *H01L 29/0653* (2013.01); *H01L 29/1095* (2013.01); *H01L 29/66681* (2013.01); *H01L 29/7816* (2013.01)

(58) Field of Classification Search
CPC ............. H01L 29/0634; H01L 29/0653; H01L 29/1095; H01L 29/66681; H01L 29/7816; H01L 21/26513; H01L 21/266; H01L 21/324
See application file for complete search history.

(56) References Cited

U.S. PATENT DOCUMENTS

| | | | | |
|---|---|---|---|---|
| 5,432,366 A | * | 7/1995 | Banerjee | ............. H01L 29/1045 257/327 |
| 2008/0023767 A1 | * | 1/2008 | Voldnnan | ............ H01L 27/0255 257/355 |
| 2009/0026553 A1 | * | 1/2009 | Bhuwalka | ......... H01L 29/66356 257/402 |
| 2010/0163924 A1 | * | 7/2010 | Lin | ..................... H01L 27/0259 257/162 |

(Continued)

*Primary Examiner* — Sitaramarao S Yechuri
(74) *Attorney, Agent, or Firm* — McClure, Qualey & Rodack, LLP

(57) ABSTRACT

Structures and formation methods of a semiconductor device structure are provided. The semiconductor device structure includes a substrate, a first conductive type well region in the substrate, and a second conductive type well region in the substrate. The first conductive type is different from the second conductive type. The first conductive type well region partially overlaps the second conductive type well region in an overlapping region. The semiconductor device structure also includes a source portion in the first conductive type well region and a drain portion in the second conductive type well region. The semiconductor device structure further includes a gate structure over the substrate and the overlapping region, and between the source portion and the drain portion. The semiconductor device structure further includes a first conductive type doping region in the first conductive type well region and the overlapping region.

20 Claims, 18 Drawing Sheets

(56) References Cited

U.S. PATENT DOCUMENTS

| | | | |
|---|---|---|---|
| 2011/0115016 A1* | 5/2011 | Cha | H01L 21/76264 257/337 |
| 2013/0234198 A1* | 9/2013 | Khambaty | H01L 29/861 257/106 |
| 2014/0034999 A1* | 2/2014 | Korec | H01L 29/7393 257/140 |
| 2016/0293739 A1* | 10/2016 | Zhang | H01L 29/1033 |

\* cited by examiner

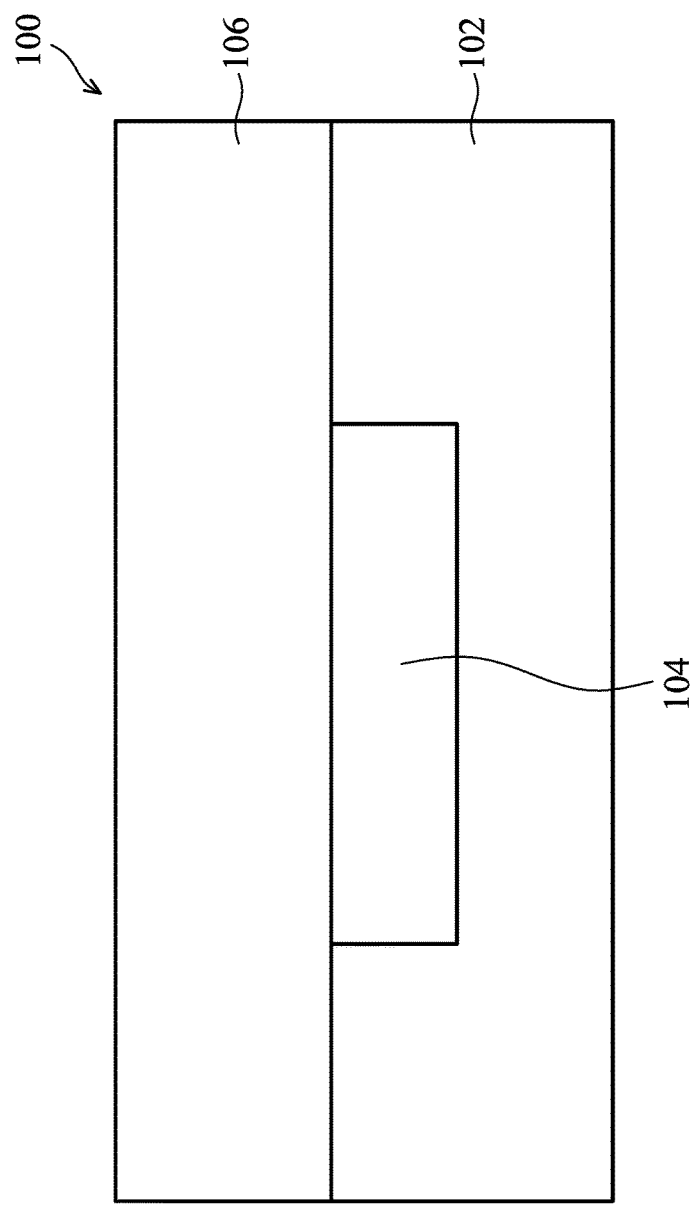

STRUCTURE AND FORMATION METHOD OF SEMICONDUCTOR DEVICE STRUCTURE WITH WELL REGIONS

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor device structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1H are cross-sectional views of various stages of a process for forming a semiconductor device structure, in accordance with some embodiments.

DETAILED DESCRIPTION

Figure 1B:
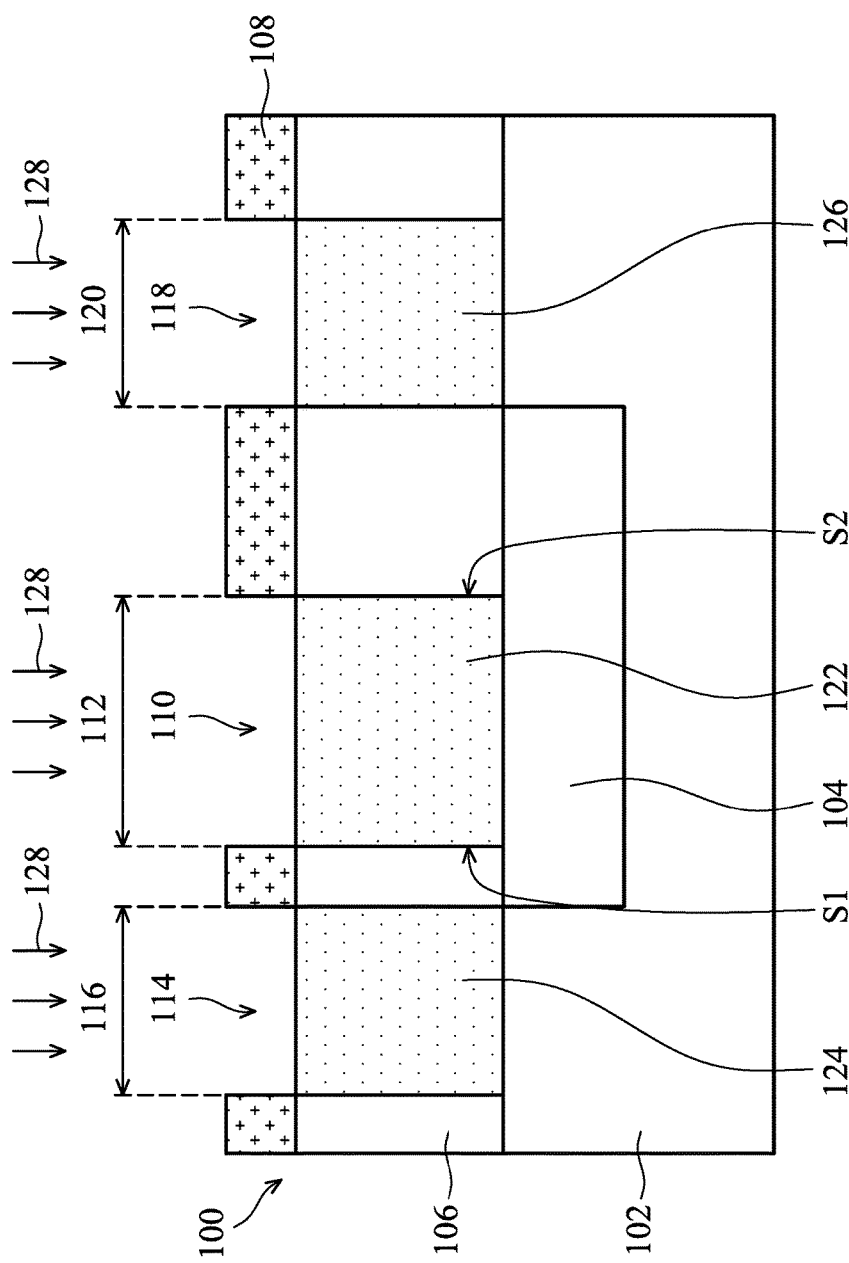

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1H are cross-sectional views of various stages of a process for forming a semiconductor device structure, in accordance with some embodiments. As shown in FIG. 1A, a semiconductor substrate 102 is received or provided, in accordance with some embodiments. In some embodiments, the semiconductor substrate 102 is a bulk semiconductor substrate, such as a semiconductor wafer. For example, the semiconductor substrate 102 is a silicon wafer. The semiconductor substrate 102 may include silicon or another elementary semiconductor material such as germanium. In some other embodiments, the semiconductor substrate 102 includes a compound semiconductor. The compound semiconductor may include gallium arsenide, silicon carbide, indium arsenide, indium phosphide, another suitable material, or a combination thereof.

In some embodiments, the semiconductor substrate 102 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 102 is an un-doped substrate. However, in some other embodiments, the semiconductor substrate 102 is a lightly doped substrate such as a lightly doped first conductive type substrate. In some embodiments, when the first conductive type is P-type, the semiconductor substrate 102 is a lightly doped P-type substrate.

Afterwards, as shown in FIG. 1A, a second conductive type buried layer 104 is formed in the semiconductor substrate 102, in accordance with some embodiments. In some embodiments, the first conductive type is different from the second conductive type. In some embodiments, the first conductive type is P-type, whereas the second conductive type is N-type. In some embodiments, the predetermined region for the second conductive type buried layer 104 is implanted with phosphorous ions or arsenic ions to form the second conductive type buried layer 104.

Afterwards, as shown in FIG. 1A, an epitaxial layer 106 is formed over the semiconductor substrate 102. In some embodiments of the present disclosure, the semiconductor substrate 102 and the epitaxial layer 106 are collectively referred to as a substrate 100. In some embodiments, the epitaxial layer 106 includes, but is not limited to, Si, Ge, Si/Ge, III-V compound, or a combination thereof. In some embodiments, the epitaxial layer 106 is formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments, the epitaxial layer 106 has the first conductive type. In some embodiments, when the first conductive type is P-type, the epitaxial layer 106 is a P-type epitaxial layer. The P-type epitaxial layer is formed by adding borane ($BH_3$) or boron tribromide ($BBr_3$) into the reaction gas to perform in-situ doping when depositing the epitaxial layer 106. Alternatively, in some other embodiments, the un-doped epitaxial layer 106 is deposited first, then the un-doped epitaxial layer 106 is ion-implanted by boron ion or indium ion.

Afterwards, as shown in FIG. 1B, a mask layer 108 is formed over the epitaxial layer 106 of the substrate 100, in accordance with some embodiments. As shown in FIG. 1B, the mask layer 108 has an opening 110 exposing a portion 112 of the epitaxial layer 106 of the substrate 100, in accordance with some embodiments. As shown in FIG. 1B, the mask layer 108 has another opening 114 exposing a portion 116 of the epitaxial layer 106, in accordance with some embodiments. As shown in FIG. 1B, the mask layer 108 has another opening 118 exposing a portion 120 of the epitaxial layer 106, in accordance with some embodiments.

Afterwards, as shown in FIG. 1B, a first conductive type well region 122, a first additional first conductive type well region 124 and a second additional first conductive type well region 126 are formed in the epitaxial layer 106 of the substrate 100, in accordance with some embodiments. In some embodiments, the first conductive type well region 122, the first additional first conductive type well region 124 and the second additional first conductive type well region 126 are formed by ion implantation processes.

As shown in FIG. 1B, a first conductive type dopant 128 is doped into the portion 112 of the epitaxial layer 106 of the substrate 100 through the opening 110 to form the first conductive type well region 122, in accordance with some embodiments. As shown in FIG. 1B, the first conductive type well region 122 is in the portion 112 of the epitaxial layer 106 of the substrate 100, in accordance with some embodiments. As shown in FIG. 1B, the first conductive type well region 122 has opposite sides S1 and S2, in accordance with some embodiments.

As shown in FIG. 1B, the first conductive type dopant 128 is also doped into the portion 116 of the epitaxial layer 106 of the substrate 100 through the opening 114 to form the first additional first conductive type well region 124, in accordance with some embodiments. As shown in FIG. 1B, the first additional first conductive type well region 124 is in the portion 116 of the epitaxial layer 106 of the substrate 100, in accordance with some embodiments.

As shown in FIG. 1B, the first conductive type dopant 128 is also doped into the portion 120 of the epitaxial layer 106 of the substrate 100 through the opening 118 to form the second additional first conductive type well region 126, in accordance with some embodiments. As shown in FIG. 1B, the second additional first conductive type well region 126 is in the portion 120 of the epitaxial layer 106 of the substrate 100, in accordance with some embodiments.

In some embodiments, when the first conductive type is P-type, the first conductive type dopant 128 is a P-type dopant such as boron ion or indium ion.

Figure 1C:
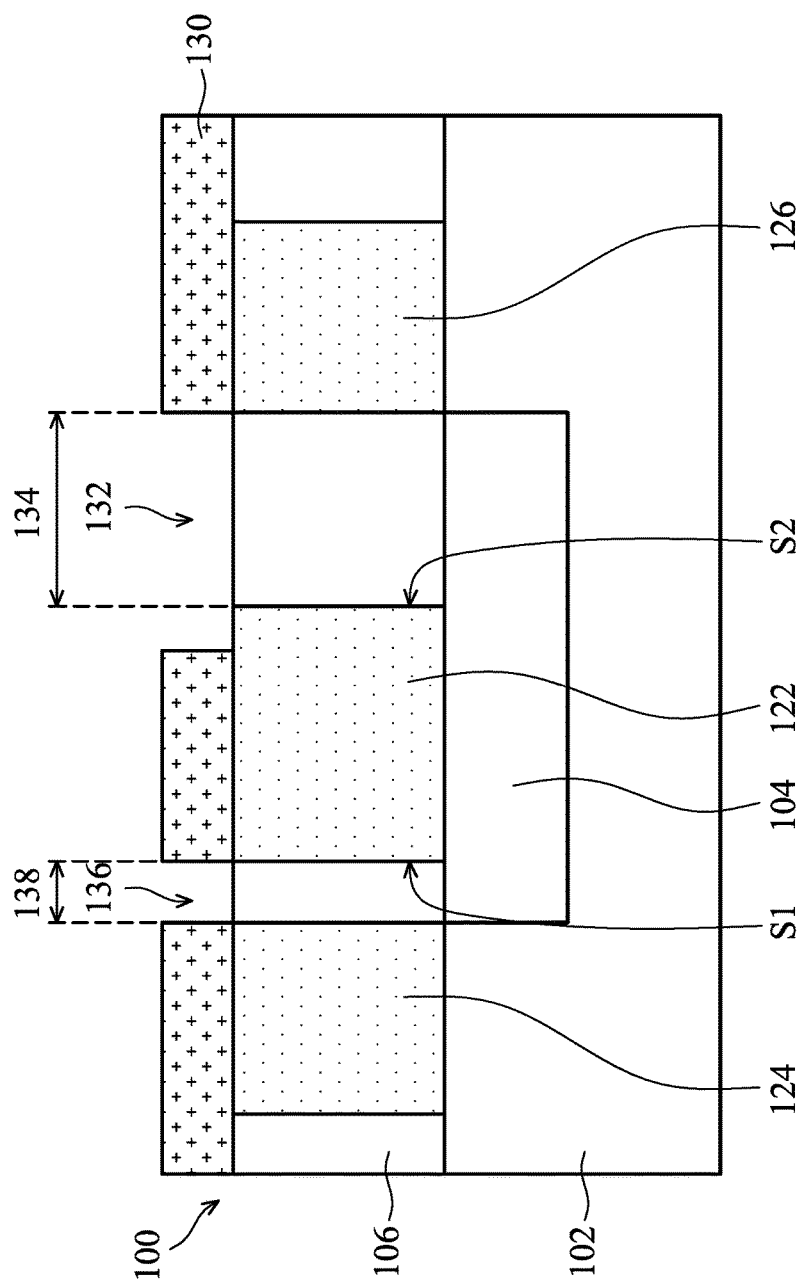

Afterwards, the mask layer 108 is removed, in accordance with some embodiments. Afterwards, as shown in FIG. 1C, a mask layer 130 is formed over the epitaxial layer 106 of the substrate 100, in accordance with some embodiments. As shown in FIG. 1C, the mask layer 130 has an opening 132, in accordance with some embodiments. As shown in FIG. 1C, the opening 132 exposes a portion 134 of the epitaxial layer 106 of the substrate 100 adjacent to the first conductive type well region 122 and the second additional first conductive type well region 126, in accordance with some embodiments. As shown in FIG. 1C, the opening 132 also exposes a portion of the first conductive type well region 122 adjacent to the portion 134.

As shown in FIG. 1C, the mask layer 130 has another opening 136 exposing a portion 138 of the epitaxial layer 106 of the substrate 100 adjacent to the first conductive type well region 122 and the first additional first conductive type well region 124.

Figure 1D:
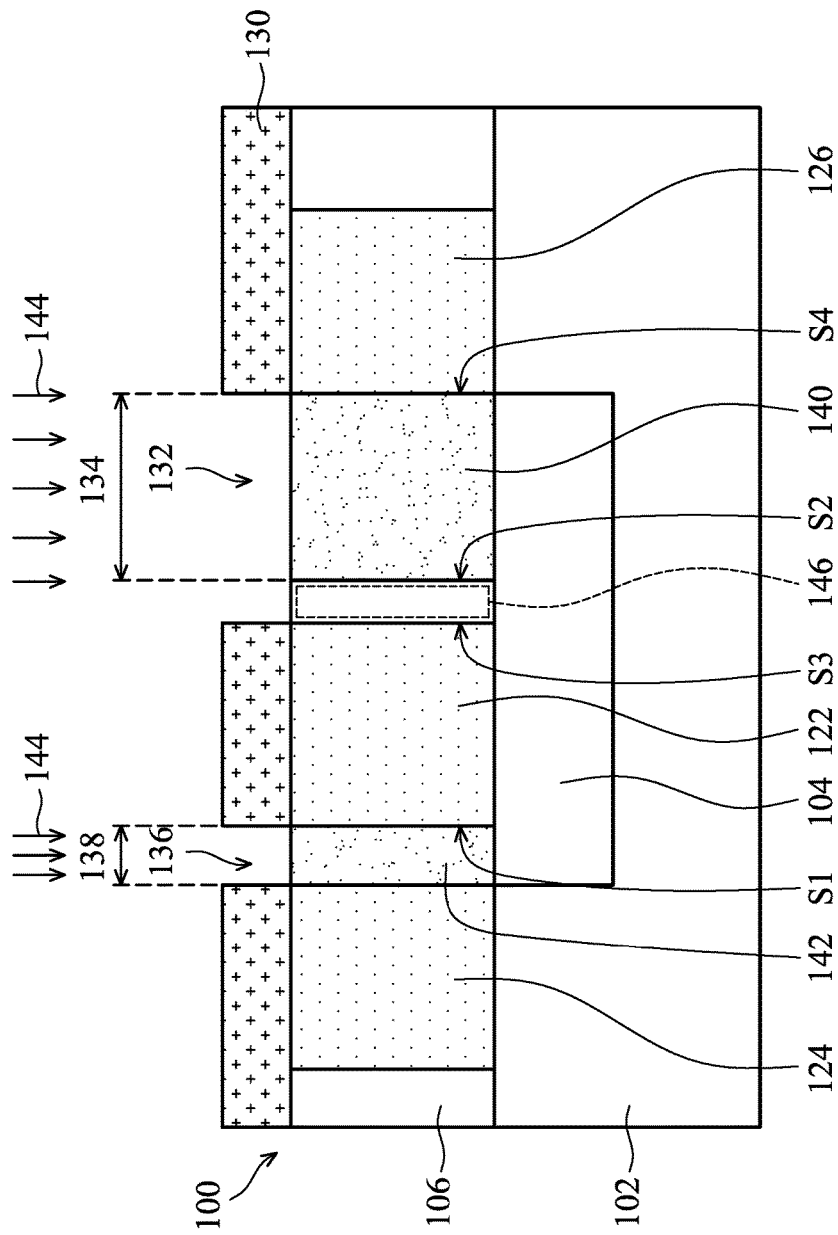

Afterwards, as shown in FIG. 1D, a second conductive type well region 140 and a first additional second conductive type well region 142 are formed in the epitaxial layer 106 of the substrate 100, in accordance with some embodiments. In some embodiments, the second conductive type well region 140 and the first additional second conductive type well region 142 are formed by ion implantation processes.

As shown in FIG. 1D, a second conductive type dopant 144 is doped into the portion 134 and the exposed portion of the first conductive type well region 122 through the opening 132 to form the second conductive type well region 140, in accordance with some embodiments. As shown in FIG. 1D, the second conductive type well region 140 is in the portion 134 of the epitaxial layer 106 of the substrate 100 and further overlaps the exposed portion of the first conductive type well region 122 to form an overlapping region 146, in accordance with some embodiments.

As shown in FIG. 1D, the second conductive type well region 140 has opposite sides S3 and S4, in accordance with some embodiments. As shown in FIG. 1D, the side S3 of the second conductive type well region 140 is positioned in the first conductive type well region 122, in accordance with some embodiments. As shown in FIG. 1D, the side S2 of the first conductive type well region 122 is positioned in the second conductive type well region 140, in accordance with some embodiments. As shown in FIG. 1D, the sides S2 and S3 are the opposite edges of the overlapping region 146, in accordance with some embodiments.

As shown in FIG. 1D, the second conductive type dopant 144 is also doped into the portion 138 of the epitaxial layer 106 of the substrate 100 through the opening 136 to form the first additional second conductive type well region 142, in accordance with some embodiments. As shown in FIG. 1D, the first additional second conductive type well region 142 is in the portion 138 of the epitaxial layer 106 of the substrate 100, in accordance with some embodiments.

In some embodiments, when the second conductive type is N-type, the second conductive type dopant 144 is an N-type dopant such as phosphorous ions or arsenic ions.

In some embodiments, after the formation of the first conductive type well region 122, the first additional first conductive type well region 124 and the second additional first conductive type well region 126, the second conductive type well region 140, and the first additional second conductive type well region 142, an annealing process is performed. In some embodiments, the annealing process is performed to activate the dopants in the first conductive type well region 122, the first additional first conductive type well region 124 and the second additional first conductive type well region 126, the second conductive type well region 140, and the first additional second conductive type well region 142. In some embodiments, the annealing process is a rapid thermal annealing process.

As shown in FIG. 1D, the first conductive type well region 122 partially overlaps the second conductive type well region 140 in the overlapping region 146, in accordance with some embodiments.

In some embodiments, the overlapping region 146 has a first doping concentration, the portion of the first conductive type well region 122 other than the overlapping region 146 has a second doping concentration, and the portion of the second conductive type well region 140 other than the overlapping region 146 has a third doping concentration. In some embodiments, the first doping concentration of the overlapping region 146 is less than the second doping concentration and the third doping concentration. In some embodiments, the first doping concentration of the overlapping region 146 is greater than zero. In some embodiments, the first doping concentration of the overlapping region 146 is in a range from about $10^2/cm^3$ to about $10^5/cm^3$, for example about $10^3/cm^3$ to about $10^4/cm^3$.

In some embodiments, the first doping concentration of the overlapping region 146 is an equivalent doping concentration. In some embodiments, when the second doping concentration of the first conductive type dopant of the first conductive type well region 122 is greater than the third doping concentration of the second conductive type dopant of the second conductive type well region 140, the equivalent doping concentration of the overlapping region 146 is obtained by subtracting the third doping concentration from the second doping concentration. In some other embodiments, when the third doping concentration of the second conductive type dopant of the second conductive type well region 140 is greater than the second doping concentration of the first conductive type dopant of the first conductive type well region 122, the equivalent doping concentration of the overlapping region 146 is obtained by subtracting the second doping concentration from the third doping concentration.

In some embodiments, since the first conductive type well region 122 partially overlaps the second conductive type well region 140 to form the overlapping region 146, the electric field of the semiconductor device structure may gradually vary from the first conductive type well region 122 to the second conductive type well region 140, rather than varying abruptly. Therefore, the breakdown voltage of the semiconductor device structure may be improved. In addition, since the overlapping region 146 has a lower doping concentration, the overlapping region 146 decreases the entire doping concentrations of the well regions in the semiconductor device structure. Therefore, in some embodiments, the overlapping region 146 also improves the breakdown voltage of the semiconductor device structure.

In some embodiments, the width of the depletion region of the semiconductor device structure is mainly determined by the overlapping region 146. In other words, the depletion region of the semiconductor device structure may be mainly tuned by the overlapping region 146. Therefore, the properties of the depletion region can be accurately controlled, and the performance of the device can be improved.

In some embodiments, the first additional first conductive type well region 124 and the second additional first conductive type well region 126 also have the second doping concentration. In some embodiments, the first additional second conductive type well region 142 also has the third doping concentration.

As shown in FIG. 1D, the first additional second conductive type well region 142 has two opposite sides, in accordance with some embodiments. As shown in FIG. 1D, the first additional first conductive type well region 124 is adjoined to one of the opposite sides of the first additional second conductive type well region 142, and the first conductive type well region 122 is adjoined to the other of the opposite sides of the first additional second conductive type well region 142, in accordance with some embodiments.

As shown in FIG. 1D, the first additional second conductive type well region 142 does not overlap with the first additional first conductive type well region 124 and the first conductive type well region 122, in accordance with some embodiments.

As shown in FIG. 1D, the second conductive type well region 140 has two opposite sides S3 and S4, in accordance with some embodiments. As shown in FIG. 1D, the second additional first conductive type well region 126 is adjoined to the side S4 of the second conductive type well region 140, in accordance with some embodiments. As shown in FIG. 1D, the other side S3 of the second conductive type well region 140 is in the first conductive type well region 122, in accordance with some embodiments.

As shown in FIG. 1D, the second conductive type well region 140 does not overlap with the second additional first conductive type well region 126, in accordance with some embodiments.

As shown in FIG. 1D, the second conductive type buried layer 104 is under the first conductive type well region 122, the second conductive type well region 140, the first additional second conductive type well region 142 and the overlapping region 146, in accordance with some embodiments.

As shown in FIG. 1D, the first conductive type well region 122, the second conductive type well region 140, the first additional second conductive type well region 142 and the overlapping region 146 contact the second conductive type buried layer 104, in accordance with some embodiments.

Figure 1E:
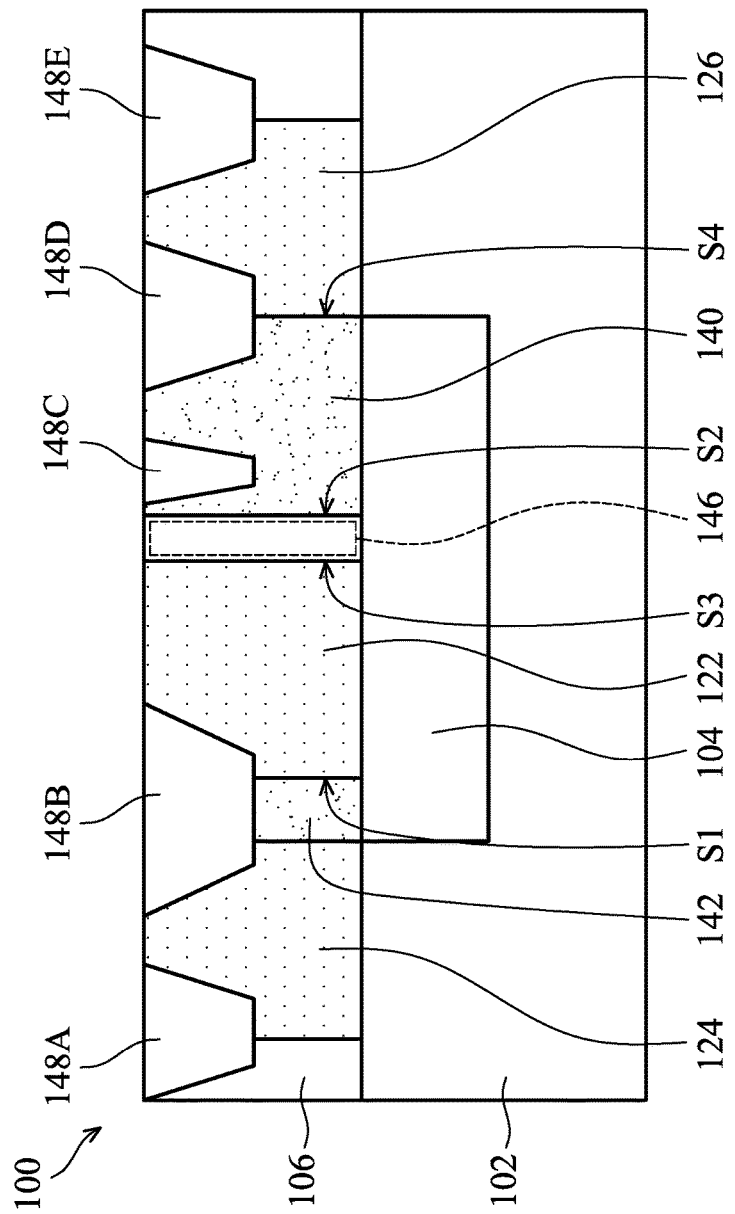

Afterwards, as shown in FIG. 1E, isolation structures 148A, 148B, 148C, 148D and 148E are formed in the epitaxial layer 106 of the substrate 100, in accordance with some embodiments. As shown in FIG. 1E, the isolation structure 148A is positioned corresponding to the interface between the first additional first conductive type well region 124 and the epitaxial layer 106, in accordance with some embodiments.

As shown in FIG. 1E, the isolation structure 148B is positioned corresponding to the first additional second conductive type well region 142, in accordance with some embodiments. As shown in FIG. 1E, the isolation structure 148C is positioned in the second conductive type well region 140, in accordance with some embodiments.

As shown in FIG. 1E, the isolation structure 148D is positioned corresponding to the interface between the second conductive type well region 140 and the second additional first conductive type well region 126, in accordance with some embodiments. As shown in FIG. 1E, the isolation structure 148E is positioned corresponding to the interface between the second additional first conductive type well region 126 and the epitaxial layer 106, in accordance with some embodiments.

In some embodiments, the isolation structures 148A, 148B, 148C, 148D and 148E include a shallow trench isolation (STI) feature, a local oxidation of silicon (LOCOS) feature, another suitable isolation structure, or a combination thereof.

In some embodiments, one or more of the isolation structures 148A, 148B, 148C, 148D and 148E has a multi-layer structure. In some embodiments, the isolation structures 148A, 148B, 148C, 148D and 148E are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the substrate 100 and the isolation structures 148A, 148B, 148C, 148D and 148E.

In some embodiments, the formation of the isolation structures 148A, 148B, 148C, 148D and 148E includes patterning the substrate 100 by a photolithography process, etching a trench in the substrate 100 (for example, by using a dry etching, wet etching, plasma etching process, or a combination thereof), and filling the trench (for example, by using a chemical vapor deposition process) with a dielectric material. In some embodiments, the filled trench has a multi-layer structure, such as a thermal oxide liner layer over the bottom surface and sidewall of the trench with silicon nitride over the liner layer.

Figure 1F:
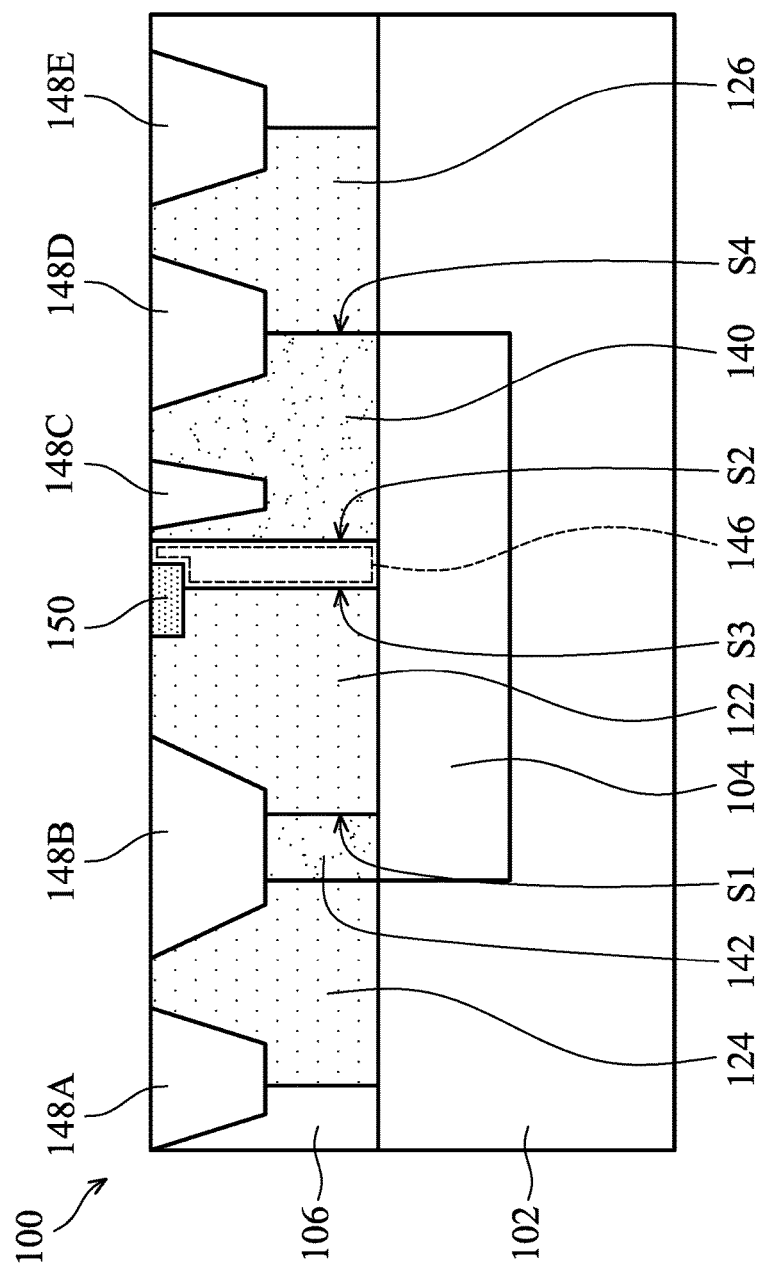

Afterwards, as shown in FIG. 1F, a first conductive type doping region 150 is formed in the first conductive type well region 122 and the overlapping region 146, in accordance with some embodiments.

In some embodiments, the first conductive type doping region 150 has an equivalent doping concentration greater than the first doping concentration of the overlapping region 146 and less than the second doping concentration of the portion of the first conductive type well region 122 other than the overlapping region 146 and the first conductive type doping region 150. In some embodiments, the equivalent doping concentration of the first conductive type doping region 150 is greater than the first doping concentration of the overlapping region 146 and less than the third doping concentration of the portion of the second conductive type well region 140 other than the overlapping region 146.

In some embodiments, a second conductive type dopant is doped into the first conductive type well region 122 to form the portion of the first conductive type doping region 150 in the first conductive type well region 122. In some embodiments, a first conductive type dopant is doped into the overlapping region 146 to form the portion of the first conductive type doping region 150 in the overlapping region 146.

In some embodiments, the first conductive type doping region 150 can shorten the channel length of the semiconductor device structure. Therefore, the on-resistance of the semiconductor device structure may be improved.

Figure 1G:
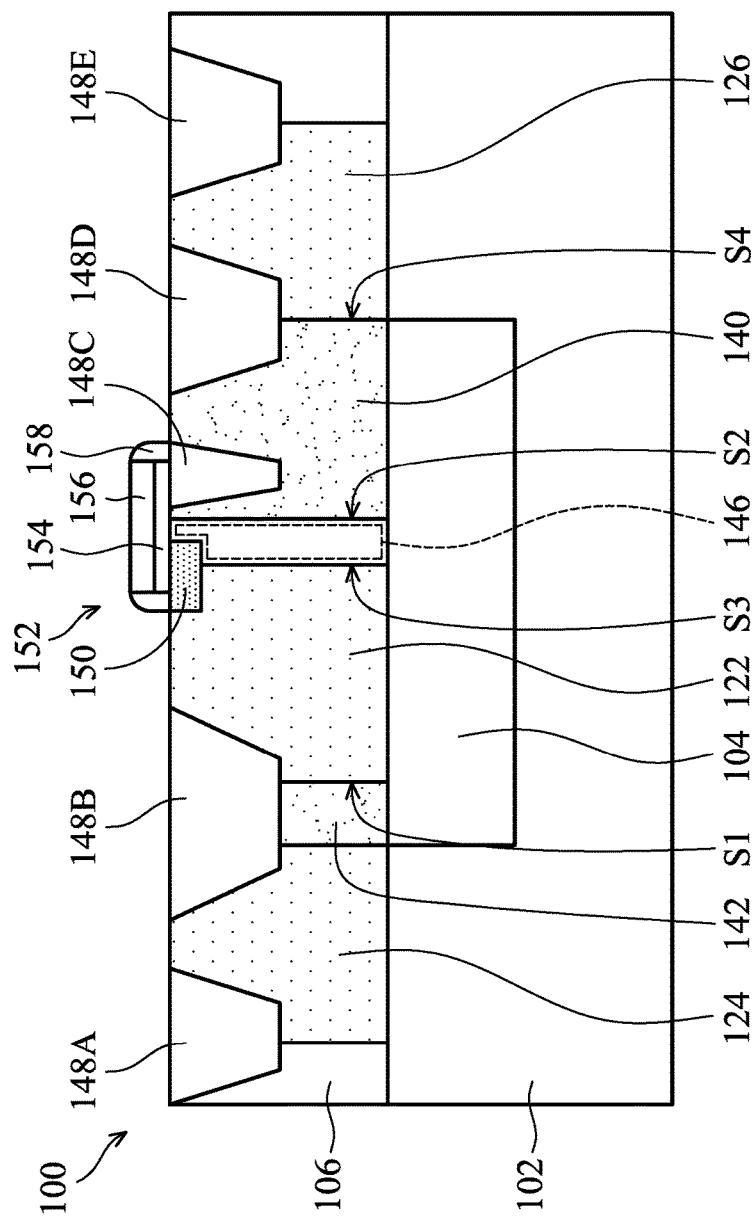

As shown in FIG. 1G, a gate structure 152 is formed over the epitaxial layer 106 of the substrate 100 and over the overlapping region 146, in accordance with some embodiments. As shown in FIG. 1G, the gate structure 152 is also positioned over the first conductive type well region 122, the second conductive type well region 140, the overlapping region 146, the first conductive type doping region 150 and the isolation structure 148C, in accordance with some embodiments. As shown in FIG. 1G, the first conductive type doping region 150 is under the gate structure 152, in accordance with some embodiments.

As shown in FIG. 1G, the gate structure 152 includes a gate dielectric layer 154 over the epitaxial layer 106 of the substrate 100 and a gate electrode 156 over the gate dielectric layer 154, in accordance with some embodiments.

In some embodiments, gate dielectric layer 154 is made of silicon oxide, silicon nitride, silicon oxynitride, high-k material, another suitable dielectric material, or a combination thereof. In some embodiments, the high-k material includes, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, another suitable high-k dielectric material, or a combination thereof.

In some embodiments, gate electrode 156 is made of polysilicon, a metal material, another suitable conductive material, or a combination thereof. In some embodiments, the metal material includes, but is not limited to, copper, aluminum, tungsten, molybdenum, titanium, tantalum, platinum, or hafnium.

In some embodiments, a gate dielectric material layer (not shown) and a gate electrode material layer (not shown) are sequentially deposited over the substrate 100. In some embodiments, the gate dielectric material layer and the gate electrode material layer are sequentially deposited by using applicable deposition methods. In some embodiments, the applicable deposition methods for depositing the gate dielectric material layer includes a chemical vapor deposition (CVD) process, an atomic layer deposition (ALD) process, a thermal oxidation process, a spin-on coating process, another applicable process, or a combination thereof. In some embodiments, the applicable deposition methods for depositing the gate electrode material layer includes a chemical vapor deposition (CVD), a physical vapor deposition (PVD) process, or another applicable method.

Afterwards, according to some embodiments, the gate dielectric material layer and the gate electrode material layer are patterned to form the gate structure 152 including the gate dielectric layer 154 and the gate electrode 156.

As shown in FIG. 1G, spacer elements 158 are formed over sidewalls of the gate structure 152, in accordance with some embodiments. In some embodiments, the spacer elements 158 are made of silicon nitride, silicon oxynitride, silicon carbide, another suitable material, or a combination thereof.

In some embodiments, a spacer layer is deposited over the substrate 100 and the gate structure 152. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the gate structure 152 form the spacer elements 158.

Figure 1H:
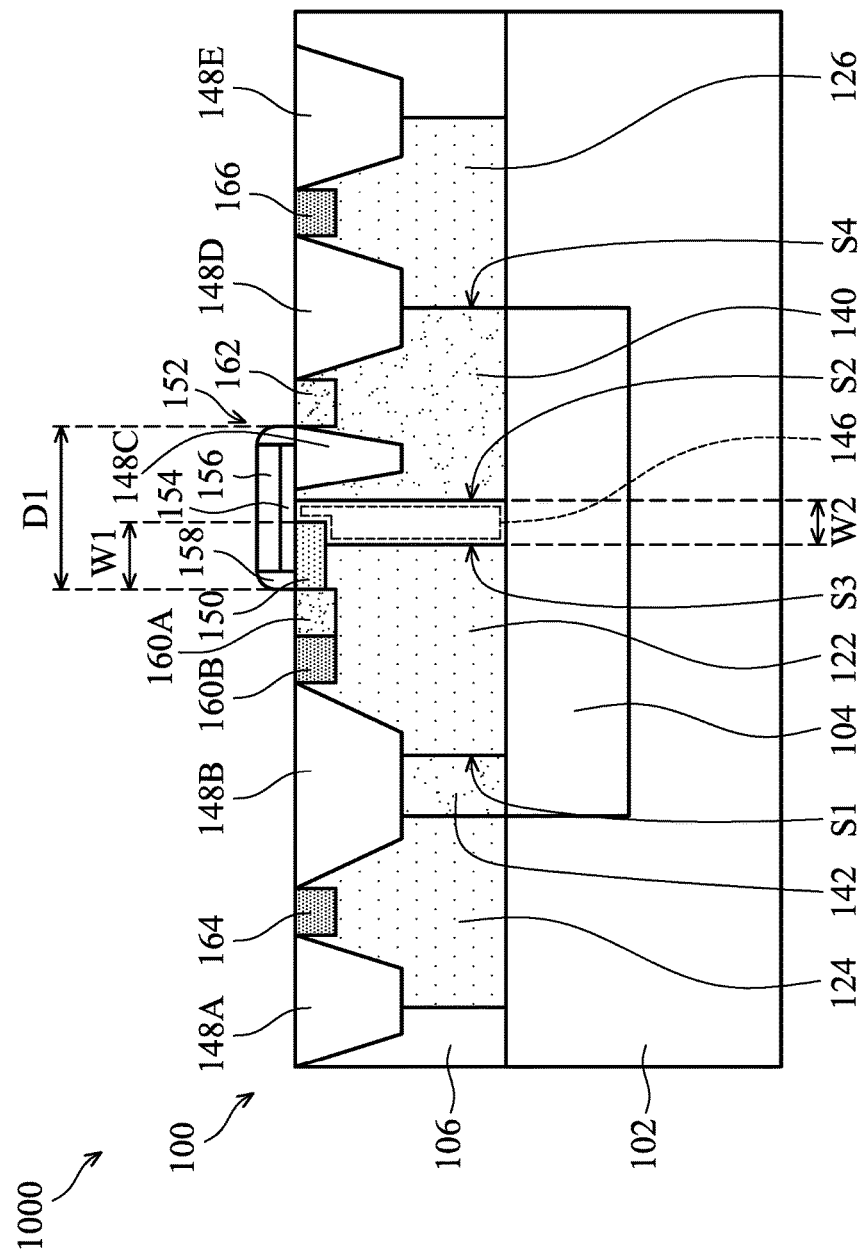

Afterwards, as shown in FIG. 1H, source portions 160A and 160B, a drain portion 162, a first bulk doping portion 164 and a second bulk doping portion 166 are formed in the epitaxial layer 106 of the substrate 100, in accordance with some embodiments. As shown in FIG. 1H, a semiconductor device structure 1000 is formed, in accordance with some embodiments. In some embodiments, the semiconductor device structure 1000 is a high voltage semiconductor device structure.

As shown in FIG. 1H, the source portions 160A and 160B are formed in the first conductive type well region 122, in accordance with some embodiments. As shown in FIG. 1H, the source portions 160A and 160B are formed between the first conductive type doping region 150 and the isolation structure 148B, in accordance with some embodiments.

As shown in FIG. 1H, the source portions 160A and 160B includes a second conductive type source portion 160A adjoined to the conductive type doping region 150, in accordance with some embodiments. As shown in FIG. 1H, the source portions 160A and 160B include a first conductive type source portion 160B adjoined to the second conductive type source portion 160A, in accordance with some embodiments.

As shown in FIG. 1H, the drain portion 162 is formed in the second conductive type well region 140, in accordance with some embodiments. As shown in FIG. 1H, the gate structure 152 is between the source portion 160A and 160B and the drain portion 162, in accordance with some embodiments. In some embodiments, the drain portion 162 has the second conductive type.

As shown in FIG. 1H, the isolation structure 148C is positioned between the drain portion 162 and the overlapping region 146, in accordance with some embodiments. As shown in FIG. 1H, the first conductive type doping region 150 is between the source portion 160A and 160B and the drain portion 162, in accordance with some embodiments.

As shown in FIG. 1H, a first bulk doping portion 164 is formed in the first additional first conductive type well region 124, in accordance with some embodiments. As shown in FIG. 1H, the first bulk doping portion 164 is positioned between the isolation structures 148A and 148B. In some embodiments, the first bulk doping portion 164 has the first conductive type.

As shown in FIG. 1H, a second bulk doping portion 166 is formed in the second additional first conductive type well region 126, in accordance with some embodiments. As shown in FIG. 1H, the second bulk doping portion 166 is positioned between the isolation structures 148D and 148E. In some embodiments, the second bulk doping portion 166 has the first conductive type.

In some embodiments, the second conductive type source portion 160A, the first conductive type source portion 160B, the drain portion 162, the first bulk doping portion 164 and the second bulk doping portion 166 are formed by ion implantation.

In some embodiments, the first conductive type is P-type and the second conductive type is N-type. In some embodiments, the predetermined regions for the first conductive type source portion 160B, the first bulk doping portion 164 and the second bulk doping portion 166 are implanted with boron ion, indium ion or boron difluoride ion ($BF_2^+$) to form the first conductive type source portion 160B, the first bulk doping portion 164 and the second bulk doping portion 166. In some embodiments, the predetermined regions for the second conductive type source portion 160A and the drain portion 162 are implanted with phosphorous ions or arsenic ions to form the second conductive type source portion 160A and the drain portion 162.

In some embodiments, the doping concentrations of the second conductive type source portion 160A, the first conductive type source portion 160B, the drain portion 162, the first bulk doping portion 164 and the second bulk doping portion 166 are greater than the doping concentrations of the first conductive type well region 122, the first additional first conductive type well region 124, the second additional first conductive type well region 126, the second conductive type well region 140 and the first additional second conductive type well region 142.

In some embodiments, the doping concentrations of the first conductive type well region 122, the first additional first conductive type well region 124, the second additional first conductive type well region 126, the second conductive type well region 140 and the first additional second conductive type well region 142 are greater than the doping concentration of the first conductive type doping region 150.

In some embodiments, the doping concentration of the first conductive type doping region 150 is greater than the doping concentration of the second conductive type buried layer 104. In some embodiments, the doping concentration of the second conductive type buried layer 104 is greater than the doping concentration of the epitaxial layer 106. In some embodiments, the doping concentration of the epitaxial layer 106 is greater than the doping concentration of the overlapping region 146.

As shown in FIG. 1H, the semiconductor device structure 1000 includes a substrate 100, in accordance with some embodiments. As shown in FIG. 1H, the substrate 100 includes the semiconductor substrate 102 and the epitaxial layer 106 formed over the semiconductor substrate 102, in accordance with some embodiments. As shown in FIG. 1H, the semiconductor device structure 1000 further includes the second conductive type buried layer 104 formed in the semiconductor substrate 102 of the substrate 100, in accordance with some embodiments.

As shown in FIG. 1H, the semiconductor device structure 1000 further includes the first conductive type well region 122 and the second conductive type well region 140 in the epitaxial layer 106 of the substrate 100, in accordance with some embodiments. As shown in FIG. 1H, the first conductive type well region 122 partially overlaps the second conductive type well region 140 in the overlapping region 146, in accordance with some embodiments.

As shown in FIG. 1H, the semiconductor device structure 1000 further includes the first additional second conductive type well region 142 in the epitaxial layer 106 of the semiconductor substrate 100 and adjacent to the first conductive type well region 122, in accordance with some embodiments. As shown in FIG. 1H, the semiconductor device structure 1000 further includes the first additional first conductive type well region 124 in the epitaxial layer 106 of the semiconductor substrate 100 and adjacent to the first additional second conductive type well region 142, in accordance with some embodiments.

As shown in FIG. 1H, the semiconductor device structure 1000 further includes the second additional first conductive type well region 126 in the epitaxial layer 106 of the semiconductor substrate 100 and adjacent to the second conductive type well region 140, in accordance with some embodiments. As shown in FIG. 1H, the semiconductor device structure 1000 further includes the isolation structures 148A, 148B, 148C, 148D and 148E in the epitaxial layer 106 of the substrate 100, in accordance with some embodiments.

As shown in FIG. 1H, the semiconductor device structure 1000 further includes the first conductive type doping region 150 formed in the first conductive type well region 122 and the overlapping region 146, in accordance with some embodiments. As shown in FIG. 1H, the semiconductor device structure 1000 further includes the source portions 160A and 160B in the first conductive type well region 122, the drain portion 162 in the second conductive type well region 140, in accordance with some embodiments. As shown in FIG. 1H, the semiconductor device structure 1000 further includes the first bulk doping portion 164 in the first additional first conductive type well region 124, and the second bulk doping portion 166 in the second additional first conductive type well region 126, in accordance with some embodiments.

As shown in FIG. 1H, the semiconductor device structure 1000 further includes the gate structure 152 formed over the epitaxial layer 106 of the substrate 100 and over the overlapping region 146, in accordance with some embodiments.

As shown in FIG. 1H, the distance between the source portion 160A and the drain portion 162 and parallel to the main surface of the substrate 100 is distance D1, in accordance with some embodiments. As shown in FIG. 1H, the width of the first conductive type doping region 150 is width W1, in accordance with some embodiments. In some embodiments, the width W1 is in a range from about 10% to about 40% of distance D1, for example from about 20% to about 40% of distance D1.

In some cases, if the width of the first conductive type doping region is too small, for example smaller than about 10% of the distance between the source portion and the drain portion, the channel length of the semiconductor device structure might not be effectively shortened. However, in some other cases, if the width of the first conductive type doping region is too great, for example greater than about 40% of the distance between the source portion and the drain portion, the breakdown voltage of the semiconductor device structure might not be effectively improved.

As shown in FIG. 1H, the width of the overlapping region 146 is width W2, in accordance with some embodiments. In some embodiments, the width W2 is in a range from about 5% to about 30% of distance D1, for example from about 10% to about 20% of distance D1.

In some cases, if the width of the overlapping region is too great, for example greater than about 30% of the distance between the source portion and the drain portion, the channel length of the semiconductor device structure might be increased. However, in some other cases, if the width of the overlapping region is too small, for example smaller than about 5% of the distance between the source portion and the drain portion, the breakdown voltage of the semiconductor device structure might not be effectively improved.

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

In some cases, the first conductive type well region does not overlap with the second conductive type well region, and no overlapping region is formed. In these cases, the electric field of the semiconductor device structure varies abruptly from the first conductive type well region to the second conductive type well region. Therefore, the breakdown voltage of the semiconductor device structure may be low. In addition, since no overlapping region is formed to decrease the entire doping concentrations of the well regions, the breakdown voltage cannot be improved.

In addition, in these cases, the depletion region of the semiconductor device structure is formed by the diffusion of the dopants in the first conductive type well region and the second conductive type well region. In these cases, the equivalent doping concentration of the depletion region is substantially zero, and the width of the depletion region is smaller than about 3% of the distance between the source portion and the drain portion.

Within the context of this specification, the word "substantially" means preferably at least 90%, more preferably 95%, even more preferably 98%, most preferably 99%.

In some embodiments, since the first conductive type well region partially overlaps the second conductive type well region to form the overlapping region under the gate structure, the electric field of the semiconductor device structure may gradually vary from the first conductive type well region to the second conductive type well region. Therefore, the breakdown voltage of the semiconductor device structure may be improved. In addition, since the overlapping region has a lower doping concentration, the overlapping region decreases the entire doping concentrations of the well regions in the semiconductor device structure. Therefore, in some embodiments, the overlapping region also improves the breakdown voltage of the semiconductor device structure.

In some embodiments, the width of the depletion region of the semiconductor device structure is mainly determined by the overlapping region. Therefore, the properties of the depletion region can be accurately controlled, and the performance of the device can be improved. In addition, in some embodiments, the first conductive type doping region can shorten the channel length of the semiconductor device structure. Therefore, the on-resistance of the semiconductor device structure may be improved.

Figure 2A:
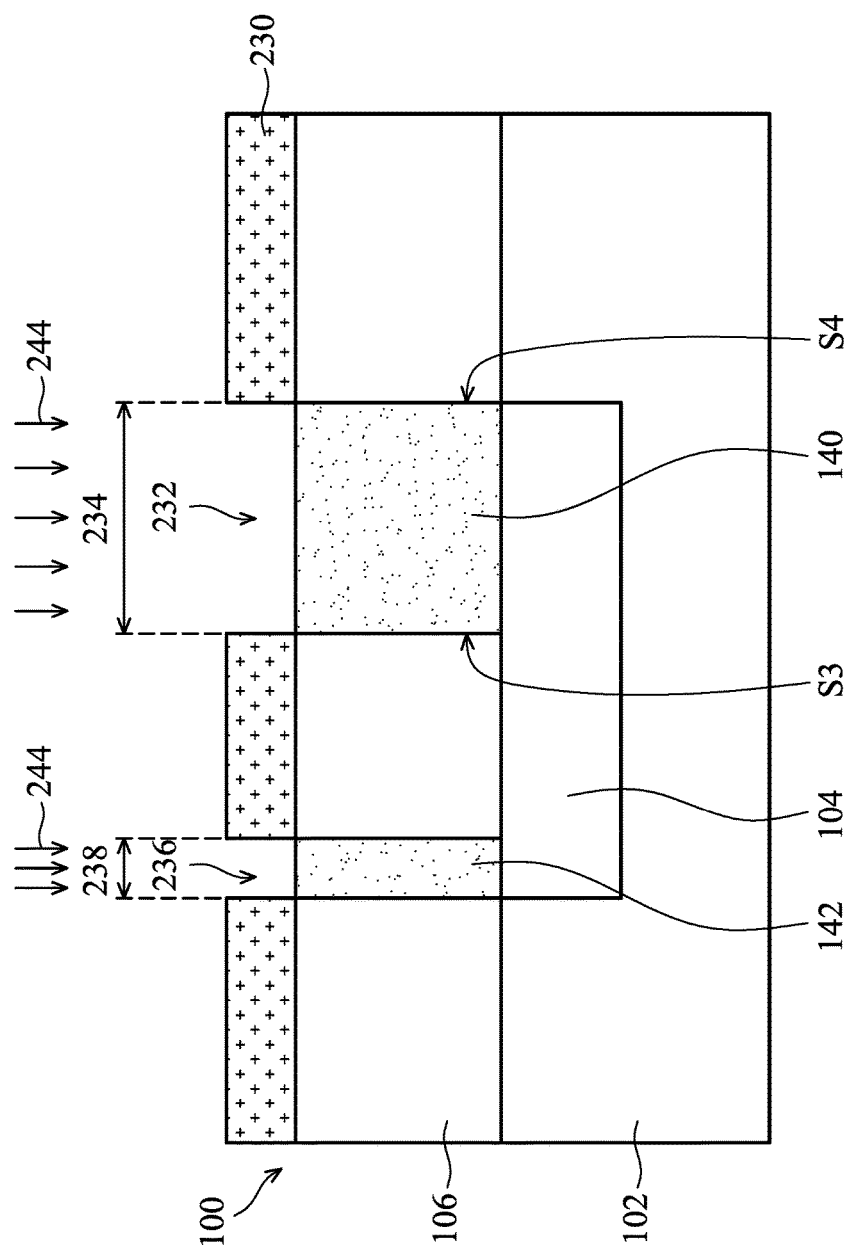
FIGS. 2A-2C are cross-sectional views of various stages of a process for forming a semiconductor device structure, in accordance with some embodiments.
Figure 2B:
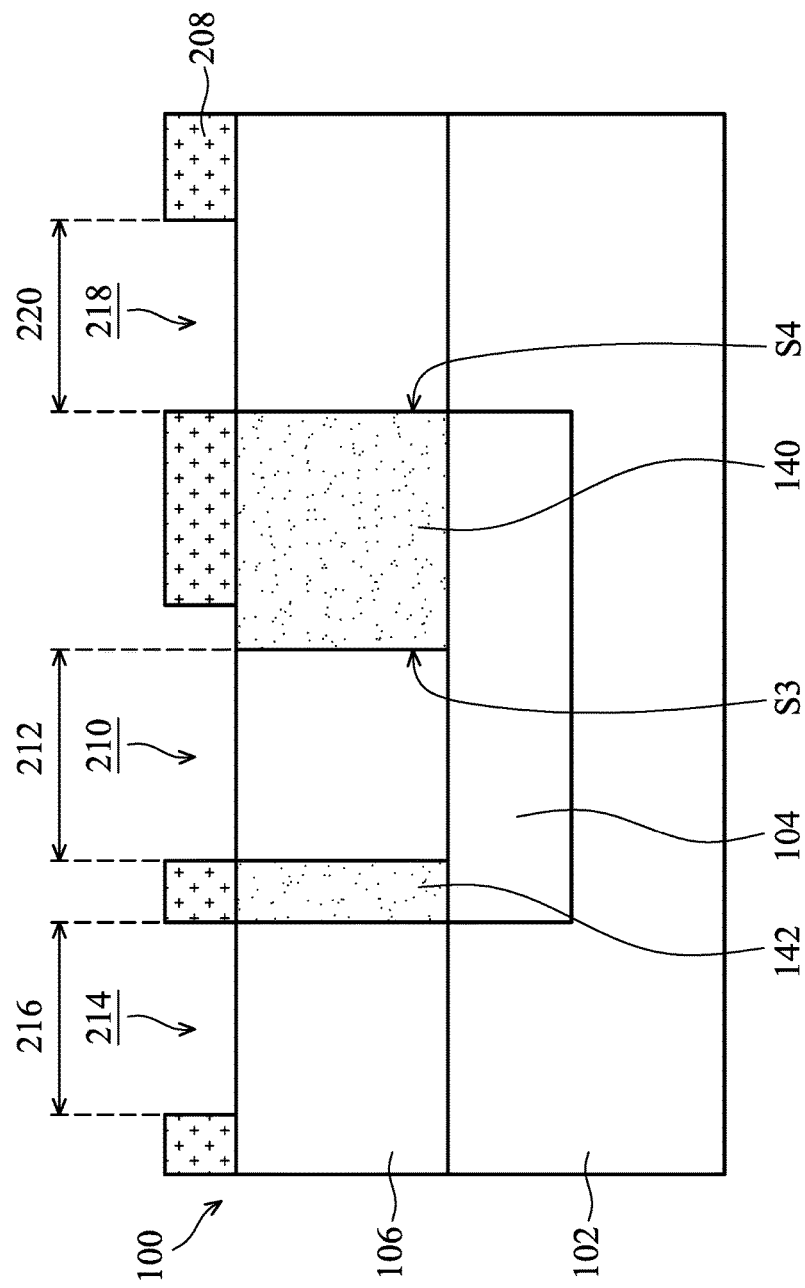
Figure 2C:
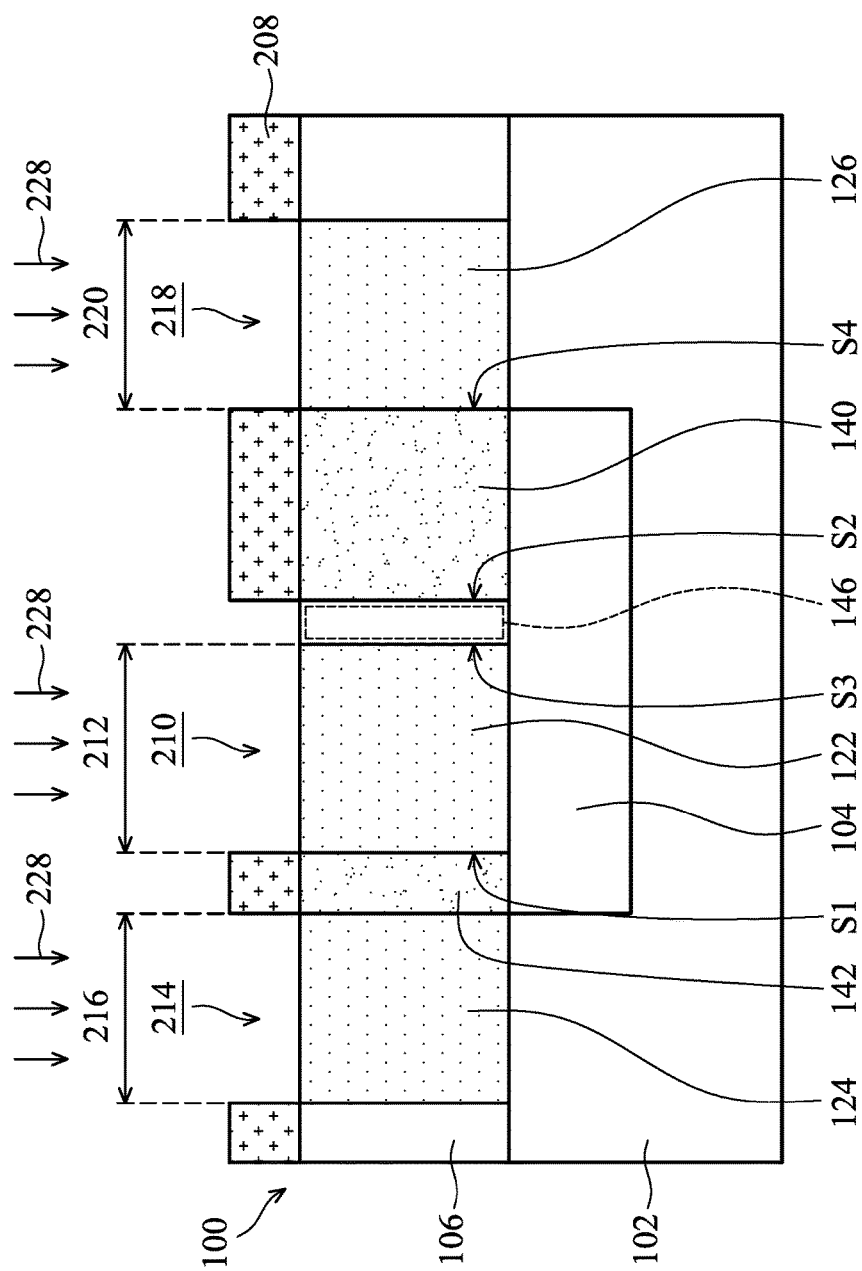

It should be noted that the exemplary embodiment set forth in FIGS. 1A-1H is merely for the purpose of illustration. In addition to the embodiment set forth in FIGS. 1A-1H, the overlapping region may be formed by other processes as shown in FIGS. 2A-2C. This will be described in more detail in the following description. Therefore, the present disclosure is not limited to the exemplary embodiment shown in FIGS. 1A-1H.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 2A, a mask layer 230 is formed over the epitaxial layer 106 of the substrate 100, in accordance with some embodiments. As shown in FIG. 2A, the mask layer 230 has an opening 232, in accordance with some embodiments. As shown in FIG. 2A, the opening 232 exposes a portion 234 of the epitaxial layer 106 of the substrate 100, in accordance with some embodiments. As shown in FIG. 2A, the mask layer 230 has another opening 236 exposing a portion 238 of the epitaxial layer 106 of the substrate 100, in accordance with some embodiments.

Afterwards, as shown in FIG. 2A, a second conductive type dopant 244 is doped into the portion 234 to form the second conductive type well region 140, in accordance with some embodiments. As shown in FIG. 1D, the second conductive type dopant 244 is also doped into the portion 238 of the epitaxial layer 106 of the substrate 100 through the opening 236 to form the first additional second conductive type well region 142, in accordance with some embodiments. Afterwards, the mask layer 230 is removed, in accordance with some embodiments.

Afterwards, as shown in FIG. 2B, a mask layer 208 is formed over the epitaxial layer 106 of the substrate 100, in accordance with some embodiments. As shown in FIG. 2B, the mask layer 208 has an opening 210 exposing a portion 212 of the epitaxial layer 106 of the substrate 100 adjacent to the second conductive type well region 140 and the first additional second conductive type well region 142, in accordance with some embodiments. As shown in FIG. 2B, the opening 210 also exposes a portion of the second conductive type well region 140, in accordance with some embodiments. As shown in FIG. 2B, the mask layer 208 has another opening 214 exposing a portion 216 of the epitaxial layer 106 adjacent to the first additional second conductive type well region 142, in accordance with some embodiments. As shown in FIG. 2B, the mask layer 208 has another opening 218 exposing a portion 220 of the epitaxial layer 106 adjacent to the second conductive type well region 140 adjacent to the portion 212, in accordance with some embodiments.

Afterwards, as shown in FIG. 2C, a first conductive type dopant 228 is doped into the portion 212 of the epitaxial layer 106 and into the exposed portion of the second conductive type well region 140 through the opening 210 to form the first conductive type well region 122, in accordance with some embodiments. As shown in FIG. 2C, the first conductive type well region 122 partially overlaps the second conductive type well region 140 in the overlapping region 146, in accordance with some embodiments.

As shown in FIG. 2C, the first conductive type dopant 228 is also doped into the portion 216 of the epitaxial layer 106 of the substrate 100 through the opening 214 to form the first additional first conductive type well region 124, in accordance with some embodiments. As shown in FIG. 2C, the first conductive type dopant 228 is also doped into the portion 220 of the epitaxial layer 106 of the substrate 100 through the opening 218 to form the second additional first conductive type well region 126, in accordance with some embodiments. Afterwards, by performing the same or similar processes as shown in FIGS. 1E-1H, the semiconductor device structure shown in FIG. 1H is formed.

Figure 3A:
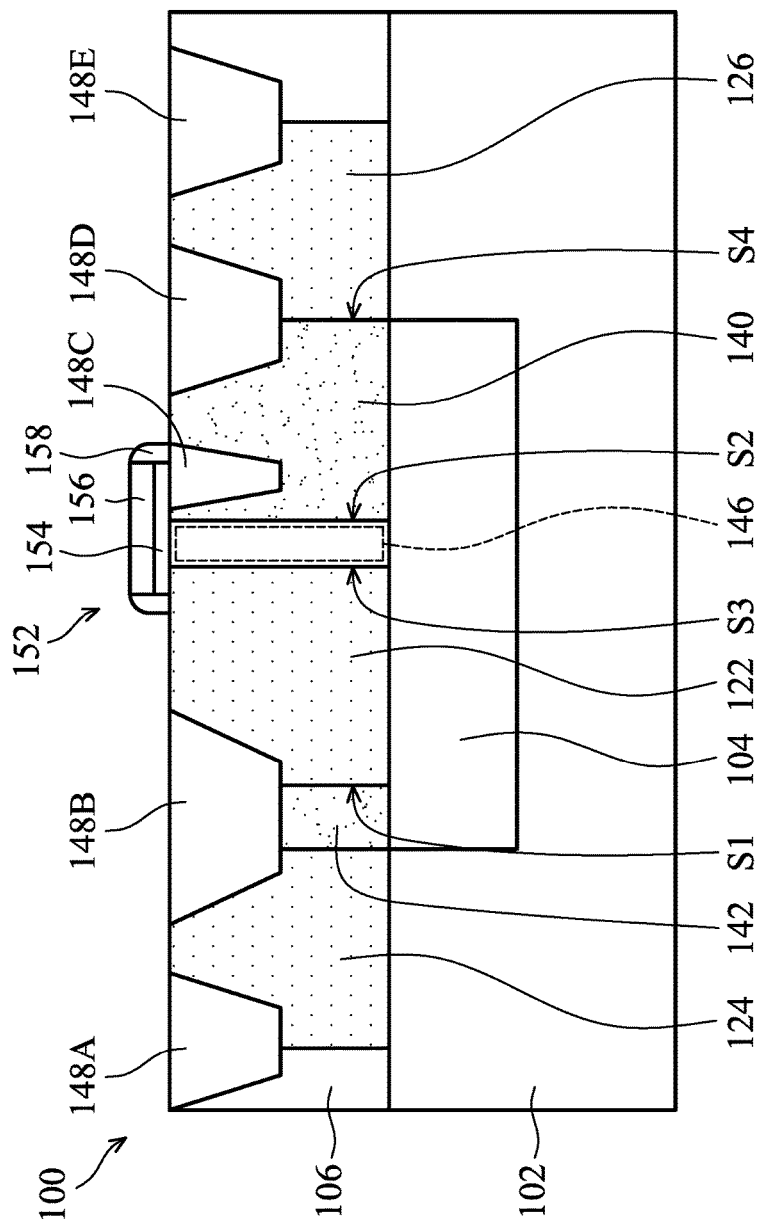
FIGS. 3A-3B are cross-sectional views of various stages of a process for forming a semiconductor device structure, in accordance with some embodiments.
Figure 3B:
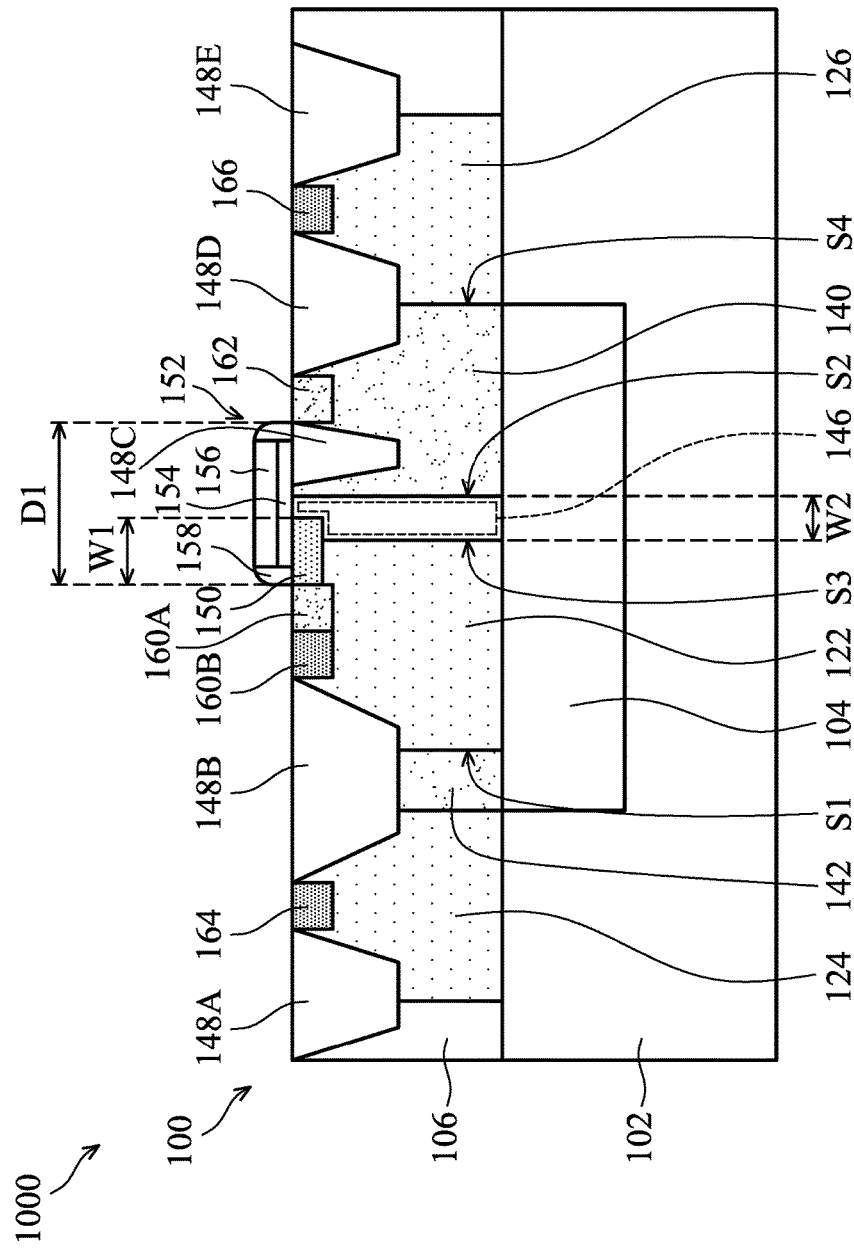

FIGS. 3A-3B are cross-sectional views of various stages of another process for forming a semiconductor device structure, in accordance with some embodiments. As shown in FIG. 3A, the first conductive type doping region 150 is not formed before the gate structure 152 is formed, in accordance with some embodiments.

Afterwards, as shown in FIG. 3B, after the gate structure 152 is formed, the first conductive type doping region 150 is formed, in accordance with some embodiments. Afterwards, the source portions 160A and 160B, the drain portion 162, the first bulk doping portion 164 and the second bulk doping portion 166 are formed, in accordance with some embodiments.

Figure 4:
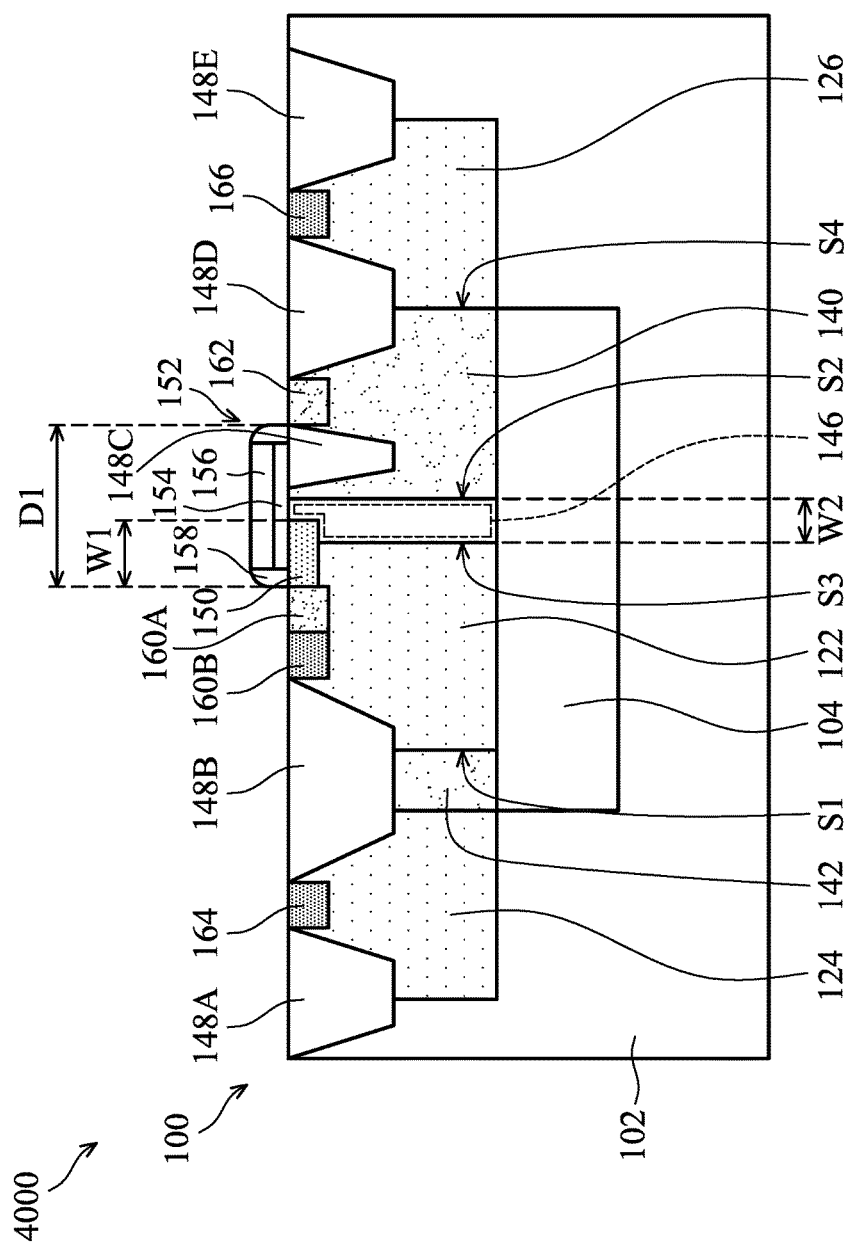
FIG. 4 is a cross-sectional view of a semiconductor device structure, in accordance with some embodiments.

FIG. 4 is a cross-sectional view of a semiconductor device structure 4000, in accordance with some embodiments. As shown in FIG. 4, the substrate 100 includes the semiconductor substrate 102, but does not include the epitaxial layer, in accordance with some embodiments. As shown in FIG. 4, the gate structure 152 is formed over the semiconductor substrate 102, in accordance with some embodiments. As shown in FIG. 4, the other elements and doping regions are formed in the semiconductor substrate 102, in accordance with some embodiments. In addition, in some embodiments of the present disclosure, the second conductive type buried layer 104 is also referred to as a deep second conductive type well, for example, a deep N-well.

Figure 5A:
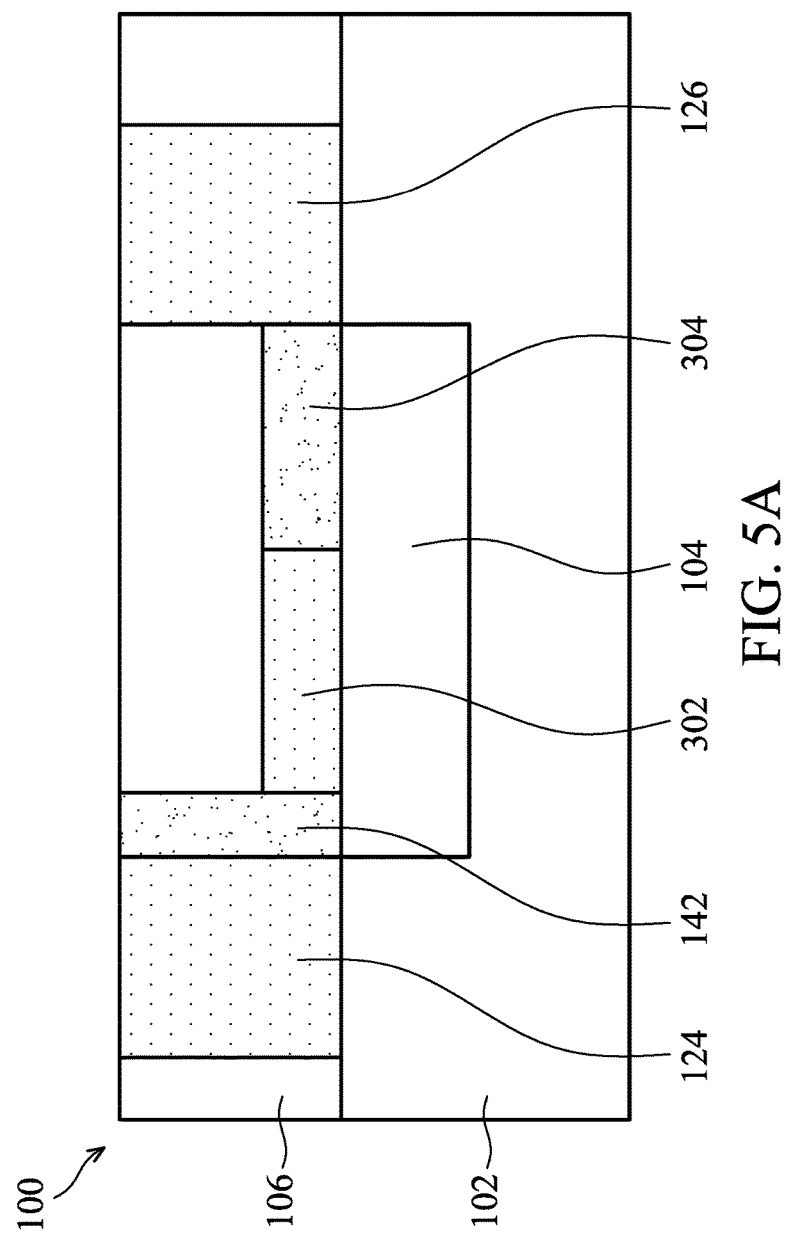
FIGS. 5A-5C are cross-sectional views of various stages of a process for forming a semiconductor device structure, in accordance with some embodiments.

It should be noted that the exemplary embodiments set forth in FIGS. 1A-4 are merely for the purpose of illustration. In addition to the embodiments set forth in FIGS. 1A-4, the semiconductor device structure may have another configuration as shown in FIGS. 5A-6. This will be described in more detail in the following description. Therefore, the present disclosure is not limited to the exemplary embodiments shown in FIGS. 1A-4.

As shown in FIG. 5A, after the first additional first conductive type well region 124, the second additional first conductive type well region 126 and the first additional second conductive type well region 142 are formed, a first conductive type sub-well region 302 and a second conductive type sub-well region 304 are formed, in accordance with some embodiments. As shown in FIG. 5A, the first conductive type sub-well region 302 and the second conductive type sub-well region 304 are adjoined to each other, but do not overlap with each other, in accordance with some embodiments.

As shown in FIG. 5A, the first conductive type sub-well region 302 and the second conductive type sub-well region 304 contact the second conductive type buried layer 104, in accordance with some embodiments. As shown in FIG. 5A, the first conductive type sub-well region 302 and the second conductive type sub-well region 304 are spaced apart from the top surface of the epitaxial layer 106 of the substrate 100, in accordance with some embodiments.

Figure 5B:
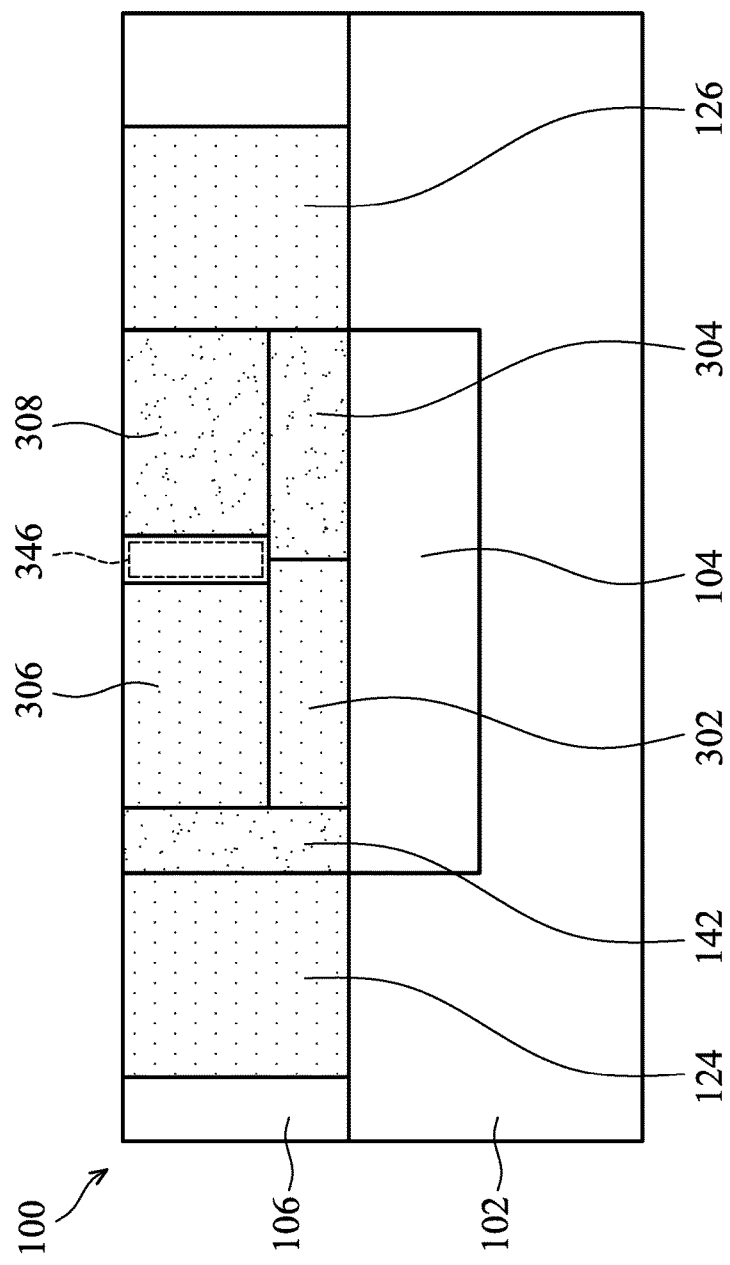
Figure 6:
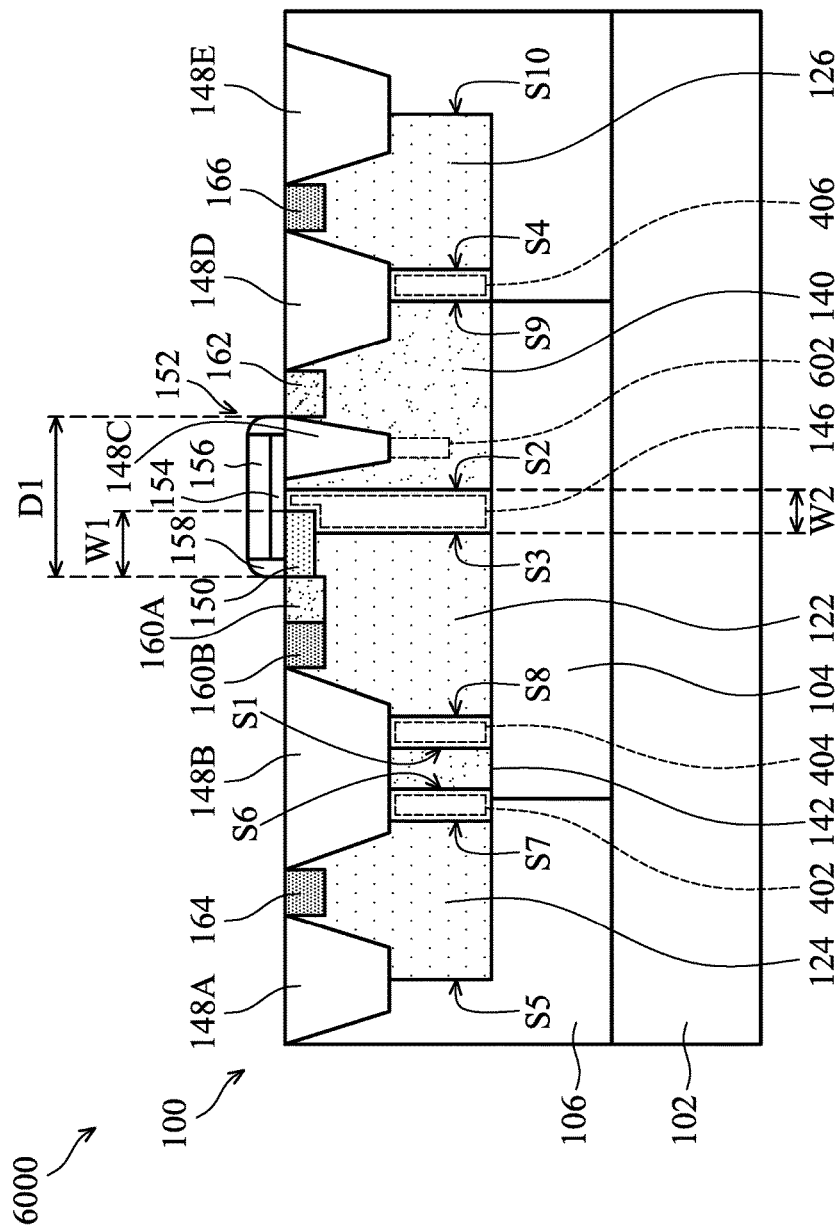
FIG. 6 is a cross-sectional view of a semiconductor device structure, in accordance with some embodiments.

Afterwards, as shown in FIG. 5B, a first conductive type sub-well region 306 and a second conductive type sub-well region 308 are formed by methods that are similar to those shown in FIGS. 1B-1D or FIGS. 2A-2C, in accordance with some embodiments. As shown in FIG. 5B, the first conductive type sub-well regions 306 and 308 contact the top surface of the epitaxial layer 106 of the substrate 100, in accordance with some embodiments.

As shown in FIG. 5B, the first conductive type sub-well region 306 connects the first conductive type sub-well region 302, in accordance with some embodiments. In some embodiments, the first conductive type sub-well regions 302 and 306 form the first conductive type well region. As shown in FIG. 5B, the second conductive type sub-well region 308 connects the second conductive type sub-well region 304, in accordance with some embodiments. In some embodiments, the second conductive type sub-well regions 304 and 308 form the second conductive type well region.

As shown in FIG. 5B, the first conductive type sub-well region 306 and the second conductive type sub-well region 308 are spaced apart from the second conductive type buried layer 104, in accordance with some embodiments. As shown in FIG. 5B, the first conductive type sub-well region 306 and the second conductive type sub-well region 308 partially overlap each other in the overlapping region 346, in accordance with some embodiments. As shown in FIG. 5B, the overlapping region 346 is spaced apart from the second conductive type buried layer 104.

The embodiments of the present disclosure are not limited thereto. In some other embodiments, the first additional first conductive type well region 124, the second additional first conductive type well region 126 and the first additional second conductive type well region 142 are formed after the first conductive type sub-well region 306 and the second conductive type sub-well region 308 are formed. The first additional first conductive type well region 124, the second additional first conductive type well region 126 and the first additional second conductive type well region 142 may be formed at any suitable stage.

In some embodiments, the first conductive type sub-well region 302 and the second conductive type sub-well region 304 have the same widths. However, in some other embodiments, the first conductive type sub-well region 302 and the second conductive type sub-well region 304 have different widths.

Figure 5C:
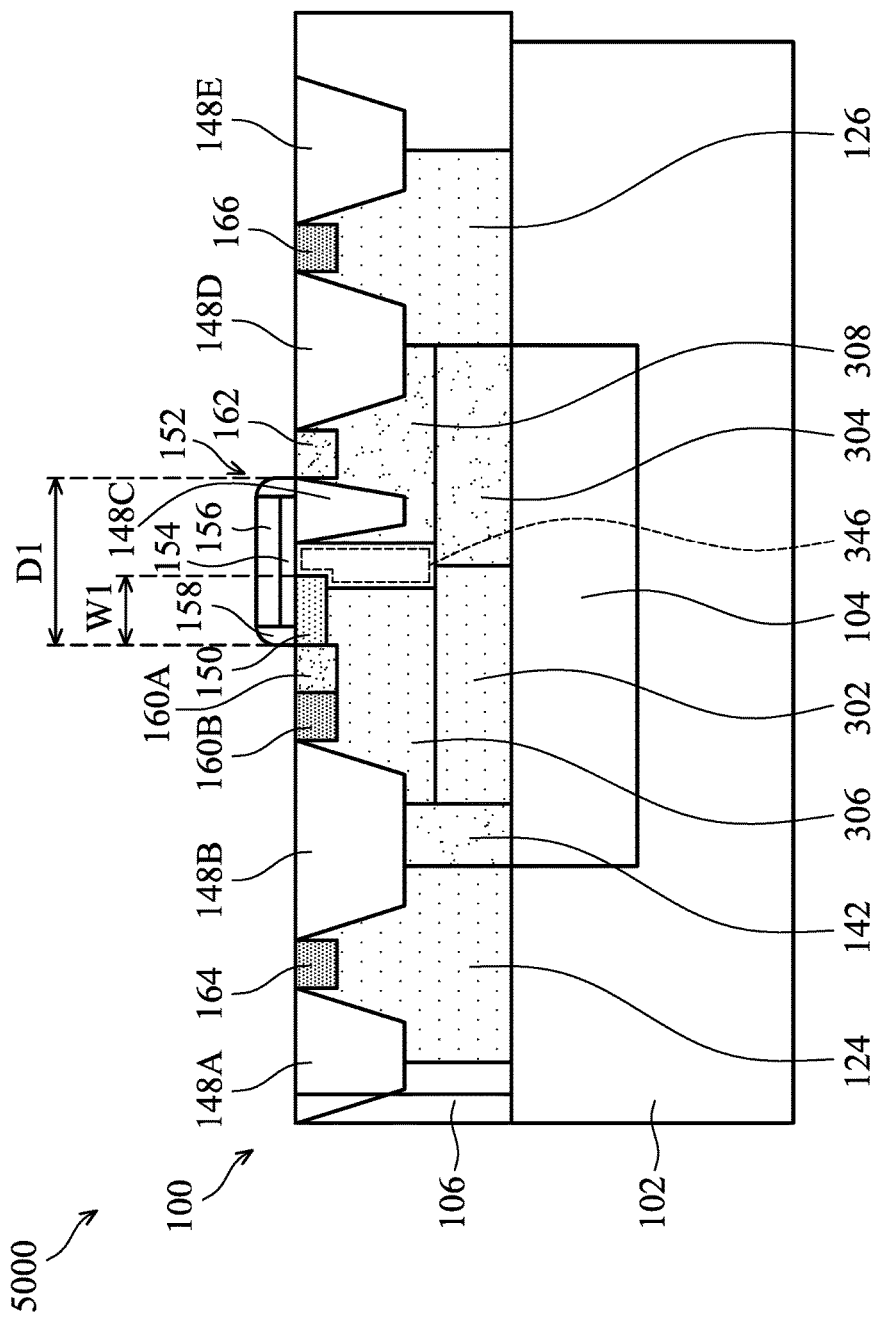

Afterwards, by performing the same or similar processes to what is shown in FIGS. 1E-1H, the semiconductor device structure 5000 shown in FIG. 5C is formed. In some embodiments, the depth of the overlapping region 346 is deeper than the depth of the isolation structure 148C. In some other embodiments, the depth of the overlapping region 346 is substantially equal to the depth of the isolation structure 148C. In still other embodiments, the depth of the overlapping region 346 is less than the depth of the isolation structure 148C.

FIG. 6 is a cross-sectional view of a semiconductor device structure 6000, in accordance with some embodiments. The difference between the embodiment shown in FIG. 1H and the embodiment shown in FIG. 4 is that the semiconductor device structure 6000 further includes an additional first conductive type well region 602 in the second conductive type well region 140, in accordance with some embodiments. As shown in FIG. 6, the additional first conductive type well region 602 is spaced apart from the second conductive type buried layer 104, in accordance with some embodiments. As shown in FIG. 6, the additional first conductive type well region 602 is spaced apart from the bottom of the second conductive type well region 140, in accordance with some embodiments. As shown in FIG. 6, the additional first conductive type well region 602 fully overlaps the second conductive type well region 140, in accordance with some embodiments.

Specifically, in some embodiments of the present disclosure, the additional first conductive type well region 602 and the first conductive type well region 122 are formed by the same ion implantation process. In some embodiments of the present disclosure, the third doping concentration of the second conductive type dopant of the second conductive type well region 140 is greater than the second doping concentration of the first conductive type dopant of the first conductive type well region 122. Therefore, the equivalent doping concentration of the additional first conductive type well region 602 is obtained by subtracting the second doping concentration from the third doping concentration.

In some embodiments, the equivalent doping concentration of the additional first conductive type well region 602 is less than the third doping concentration of the second conductive type well region 140. Therefore, the additional first conductive type well region 602 decreases the entire doping concentrations of the well regions in the semiconductor device structure 6000. Therefore, in some embodiments, the additional first conductive type well region 602 improves the breakdown voltage of the semiconductor device structure 6000.

The embodiments of the present disclosure are not limited thereto. In some other embodiments, the semiconductor device structure includes two or more additional first conductive type well regions 602 in the second conductive type well region 140 and/or the first additional second conductive type well region 142.

In some other embodiments, the second doping concentration of the first conductive type dopant of the first conductive type well region is greater than the third doping concentration of the second conductive type dopant of the second conductive type well region. In these embodiments, one or more additional second conductive type well regions (not shown) are formed in the first conductive type well region 122, the first additional first conductive type well region 124 and/or the second additional first conductive type well region 126 to decrease the entire doping concentrations of the well regions in the semiconductor device structure.

As shown in FIG. 6, the first additional first conductive type well region 124 has opposite sides S5 and S6 and partially overlaps the first additional second conductive type well region 142 in the overlapping region 402, in accordance with some embodiments.

As shown in FIG. 6, the first additional second conductive type well region 142 has opposite sides S7 and S8 partially overlaps the first conductive type well region 122 in the overlapping region 404, in accordance with some embodiments. As shown in FIG. 6, the second conductive type well region 140 partially overlaps the second additional first conductive type well region 126 in the overlapping region 406, in accordance with some embodiments. In some embodiments of the present disclosure, the second additional first conductive type well region 126 has opposite sides S9 and S10.

In some embodiments, the equivalent doping concentrations of the overlapping regions 402, 404 and 406 are less than the doping concentrations of the portions of the first additional first conductive type well region 124, the first additional second conductive type well region 142, the first conductive type well region 122, the second conductive type well region 140, and the second additional first conductive type well region 126 other than the overlapping regions 402, 404 and 406.

In some embodiments, the overlapping regions 402, 404 and 406 decrease the entire doping concentrations of the well regions in the semiconductor device structure 6000. Therefore, the breakdown voltage of the semiconductor device structure 6000 may be further improved.

As shown in FIG. 6, the overlapping region 402 contacts the bottom of the first additional first conductive type well region 124 and the first additional second conductive type well region 142, in accordance with some embodiments. As shown in FIG. 6, the overlapping region 404 contacts the bottom of the first additional second conductive type well region 142 and the first conductive type well region 122, in accordance with some embodiments. As shown in FIG. 6, the overlapping region 406 contacts the bottom of the second conductive type well region 140 and the second additional first conductive type well region 126, in accordance with some embodiments.

However, the embodiments of the present disclosure are not limited thereto. In some other embodiments, the overlapping region 402 is spaced apart from the bottom of the first additional first conductive type well region 124 and the first additional second conductive type well region 142. In some other embodiments, the overlapping region 404 is spaced apart from the bottom of the first additional second conductive type well region 142 and the first conductive type well region 122. In some other embodiments, the overlapping region 406 is spaced apart from the bottom of the second conductive type well region 140 and the second additional first conductive type well region 126.

As shown in FIG. 6, the width of the overlapping region 146 is greater than the widths of the overlapping regions 402, 404 and 406, in accordance with some embodiments.

However, the embodiments of the present disclosure are not limited thereto. In some other embodiments, the width of the overlapping region 146 is substantially equal to the widths of the overlapping regions 402, 404 and 406. In some other embodiments, the width of the overlapping region 146 is less than the widths of the overlapping regions 402, 404 and 406.

In some embodiments, the widths of the overlapping regions 402, 404 and 406 are substantially the same. In some other embodiments, the widths of the overlapping regions 402, 404 and 406 are different from each other.

In some embodiments, since the first conductive type well region partially overlaps the second conductive type well region to form the overlapping region under the gate structure, the electric field of the semiconductor device structure may gradually vary from the first conductive type well region to the second conductive type well region. Therefore, the breakdown voltage of the semiconductor device structure may be improved. In addition, since the overlapping region has a lower doping concentration, the overlapping region decreases the entire doping concentrations of the well regions in the semiconductor device structure. Therefore, in some embodiments, the overlapping region also improves the breakdown voltage of the semiconductor device structure.

In some embodiments, the width of the depletion region of the semiconductor device structure is mainly determined by the overlapping region. Therefore, the properties of the depletion region can be accurately controlled, and the performance of the device can be improved. In addition, in some embodiments, the first conductive type doping region can shorten the channel length of the semiconductor device structure. Therefore, the on-resistance of the semiconductor device structure may be improved.

It should be noted that although the above description merely illustrates embodiments with the first conductive type being P-type and the second conductive type being N-type, those skilled in the art will appreciate that the first conductive type may be N-type with the second conductive type being P-type.

In addition, it should be noted that the drain and source mentioned above in the present disclosure are interchangeable since the definition of the drain and source is related to the voltage connecting thereto.

Embodiments of the disclosure are not limited and may be applied to fabrication processes for any suitable technology generation. Various technology generations include a 20 nm node, a 16 nm node, a 10 nm node, or another suitable node.

In accordance with some embodiments, a semiconductor device structure is provided. The semiconductor device structure includes a substrate, a first conductive type well region in the substrate, and a second conductive type well region in the substrate. The first conductive type is different from the second conductive type. The first conductive type well region partially overlaps the second conductive type well region in an overlapping region. The semiconductor device structure also includes a source portion in the first conductive type well region and a drain portion in the second conductive type well region. The semiconductor device structure further includes a gate structure over the substrate and the overlapping region, and between the source portion and the drain portion. The semiconductor device structure further includes a first conductive type doping region in the first conductive type well region and the overlapping region.

In accordance with some embodiments, a semiconductor device structure is provided. The semiconductor device structure includes a substrate, a first conductive type well region in the substrate, a second conductive type well region in the substrate. The first conductive type is different from the second conductive type. The first conductive type well region partially overlaps the second conductive type well region in an overlapping region. The semiconductor device structure also includes a source portion in the first conductive type well region, a drain portion in the second conductive type well region. The semiconductor device structure further includes a gate structure over the substrate and the overlapping region, and between the source portion and the drain portion. The overlapping region has a first doping concentration, a portion of the first conductive type well region other than the overlapping region has a second doping concentration, and a portion of the second conductive type well region other than the overlapping region has a third doping concentration. The first doping concentration is less than the second doping concentration and the third doping concentration, and is greater than zero.

In accordance with some embodiments, a method for forming a semiconductor device structure is provided. The method includes providing a substrate, forming a first conductive type well region in the substrate, forming a second conductive type well region in the substrate that partially overlaps the first conductive type well region in an overlapping region. The first conductive type is different from the second conductive type. The method also includes forming a gate structure over the substrate and the overlapping region, forming a source portion in the first conductive type well region, and forming a drain portion in the second conductive type well region. The gate structure is between the source portion and the drain portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a first conductive type well region in the substrate;
   a second conductive type well region in the substrate, wherein the first conductive type is different from the second conductive type, and the first conductive type well region partially overlaps the second conductive type well region in an overlapping region;
   a source portion in the first conductive type well region;
   a drain portion in the second conductive type well region;
   a gate structure over the substrate and the overlapping region, and between the source portion and the drain portion; and
   a first conductive type doping region in the first conductive type well region and the overlapping region.

2. The semiconductor device structure as claimed in claim 1, further comprising:
   a buried layer in the substrate and under the first conductive type well region and the second conductive type well region,
   wherein the overlapping region contacts the buried layer.

3. The semiconductor device structure as claimed in claim 1, further comprising:

a buried layer in the substrate and under the first conductive type well region and the second conductive type well region,
wherein the overlapping region is spaced apart from the buried layer.

4. The semiconductor device structure as claimed in claim 1, further comprising:
an isolation structure in the substrate and between the drain portion and the overlapping region.

5. The semiconductor device structure as claimed in claim 1, wherein the first conductive type doping region is under the gate structure.

6. The semiconductor device structure as claimed in claim 1, wherein the first conductive type doping region has a doping concentration between a doping concentration of the overlapping region and a doping concentration of a portion of the first conductive type well region other than the overlapping region.

7. The semiconductor device structure as claimed in claim 1, wherein the first conductive type doping region is between the source portion and the drain portion.

8. The semiconductor device structure as claimed in claim 1, further comprising:
a first additional second conductive type well region in the substrate and adjacent to the first conductive type well region;
a first additional first conductive type well region in the substrate and adjacent to the first additional second conductive type well region; and
a first bulk doping portion in the first additional first conductive type well region.

9. The semiconductor device structure as claimed in claim 8, further comprising:
a second additional first conductive type well region in the substrate and adjacent to the second conductive type well region; and
a second bulk doping portion in the second additional first conductive type well region.

10. A semiconductor device structure, comprising:
a substrate;
a first conductive type well region in the substrate;
a second conductive type well region in the substrate, wherein the first conductive type is different from the second conductive type, and the first conductive type well region partially overlaps the second conductive type well region in an overlapping region;
a source portion in the first conductive type well region;
a drain portion in the second conductive type well region;
a gate structure over the substrate and the overlapping region, and between the source portion and the drain portion; and
an isolation structure in the substrate and between the drain portion and the overlapping region;
wherein the overlapping region has a first doping concentration, a portion of the first conductive type well region other than the overlapping region has a second doping concentration, and a portion of the second conductive type well region other than the overlapping region has a third doping concentration,
wherein the first doping concentration is less than the second doping concentration and the third doping concentration, and is greater than zero.

11. The semiconductor device structure as claimed in claim 10, further comprising:
a buried layer in the substrate and under the first conductive type well region, the overlapping region and the second conductive type well region,
wherein the overlapping region contacts the buried layer.

12. The semiconductor device structure as claimed in claim 10, further comprising:
a buried layer in the substrate and under the first conductive type well region, the overlapping region and the second conductive type well region,
wherein the overlapping region is spaced apart from the buried layer.

13. The semiconductor device structure as claimed in claim 10, further comprising:
a first additional second conductive type well region in the substrate and adjacent to the first conductive type well region;
a first additional first conductive type well region in the substrate and adjacent to the first additional second conductive type well region; and
a first bulk doping portion in the first additional first conductive type well region.

14. The semiconductor device structure as claimed in claim 13, further comprising:
a second additional first conductive type well region in the substrate and adjacent to the second conductive type well region; and
a second bulk doping portion in the second additional first conductive type well region.

15. A method for forming a semiconductor device structure, comprising:
providing a substrate;
forming a first conductive type well region comprising a first conductive type dopant in the substrate;
forming a second conductive type well region comprising a second conductive type dopant in the substrate, wherein the second conductive type well region partially overlaps the first conductive type well region in an overlapping region comprising the first conductive type dopant and the second conductive type dopant, wherein the first conductive type is different from the second conductive type;
forming a first conductive type doping region in the first conductive type well region and the overlapping region;
forming a gate structure over the substrate and the overlapping region;
forming a source portion in the first conductive type well region; and
forming a drain portion in the second conductive type well region, wherein the gate structure is between the source portion and the drain portion.

16. The method as claimed in claim 15, wherein the first conductive type well region and the second conductive type well region are formed by ion implantation processes.

17. The method as claimed in claim 15, wherein the formation of the first conductive type well region and the second conductive type well region comprises:
forming a first mask layer over the substrate, wherein the first mask layer has a first opening exposing a first portion of the substrate;
doping the first conductive type dopant into the first portion of the substrate through the first opening to form the first conductive type well region in the first portion of the substrate;
removing the first mask layer;
forming a second mask layer over the substrate, wherein the second mask layer has a second opening exposing a second portion of the substrate adjacent to the first conductive type well region and a portion of the first conductive type well region; and doping the second conductive type dopant into the second portion and the exposed portion of the first conductive type well region through the second opening to form the second conductive type well region, wherein the second conductive type well region is in the second portion of the substrate and overlaps the exposed portion of the first conductive type well region.

18. The method as claimed in claim 15, wherein the formation of the first conductive type well region and the second conductive type well region comprises:
   forming a first mask layer over the substrate, wherein the first mask layer has a first opening exposing a first portion of the substrate;
   doping the second conductive type dopant into the first portion of the substrate through the first opening to form the second conductive type well region in the first portion of the substrate;
   removing the first mask layer;
   forming a second mask layer over the substrate, wherein the second mask layer has a second opening exposing a second portion of the substrate adjacent to the second conductive type well region and a portion of the second conductive type well region; and
   doping the first conductive type dopant into the second portion and the exposed portion of the second conductive type well region through the second opening to form the first conductive type well region, wherein the first conductive type well region is in the second portion of the substrate and overlaps the exposed portion of the second conductive type well region.

19. The method as claimed in claim 15, wherein after the formation of the first conductive type well region and the second conductive type well region, the method further comprises:
   performing an annealing process on the first conductive type well region and the second conductive type well region.

20. The method as claimed in claim 15, wherein the overlapping region is a counter doping region of the first conductive type well region and the second conductive type well region.

* * * * *